(12) United States Patent
Ogawa et al.

(10) Patent No.: US 7,613,056 B2
(45) Date of Patent: Nov. 3, 2009

(54) SEMICONDUCTOR MEMORY DEVICE

(75) Inventors: Sumio Ogawa, Hiroshima (JP); Yasuji Koshikawa, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 12/171,081

(22) Filed: Jul. 10, 2008

(65) Prior Publication Data

US 2008/0279020 A1 Nov. 13, 2008

Related U.S. Application Data

(63) Continuation of application No. 10/564,626, filed as application No. PCT/JP2004/009959 on Jul. 13, 2004, now Pat. No. 7,417,908.

(30) Foreign Application Priority Data

Jul. 15, 2003 (JP) ............... 2003-274991

(51) Int. Cl.
*G11C 29/00* (2006.01)
(52) U.S. Cl. ............. 365/200; 365/230.03; 365/189.04; 365/189.14; 365/189.07
(58) Field of Classification Search ............ 365/200, 365/230.03, 189.04, 189.14, 189.07
See application file for complete search history.

(56) References Cited

U.S. PATENT DOCUMENTS

| | | | |
|---|---|---|---|
| 5,270,976 A * | 12/1993 | Tran | ............... 365/200 |
| 5,532,966 A | 7/1996 | Poteet et al. | |
| 5,546,349 A | 8/1996 | Watanabe et al. | |
| 5,982,680 A | 11/1999 | Wada | |
| 6,122,194 A | 9/2000 | Chung et al. | |
| 6,154,389 A | 11/2000 | Chung et al. | |
| 7,159,141 B2 * | 1/2007 | Lakhani et al. | ........ 714/8 |
| 2001/0055233 A1 | 12/2001 | Nagai | |
| 2002/0046216 A1 * | 4/2002 | Yamazaki et al. | ........ 707/201 |
| 2004/0003313 A1 * | 1/2004 | Ramirez | ........ 714/6 |
| 2004/0003315 A1 * | 1/2004 | Lakhani et al. | ........ 714/8 |

FOREIGN PATENT DOCUMENTS

| | | | |
|---|---|---|---|
| JP | 5-198199 A | 8/1993 | |
| JP | 5-242693 A | 9/1993 | |
| JP | 5-282894 A | 10/1993 | |
| JP | 6-314499 A | 11/1994 | |
| JP | 7-176200 A | 7/1995 | |
| JP | 7-220494 A | 8/1995 | |
| JP | 9-213096 A | 8/1997 | |
| JP | 9-320292 A | 12/1997 | |
| JP | 2001-143494 A | 5/2001 | |
| JP | 2002-194597 A | 7/2002 | |
| JP | 2002-367393 A | 12/2002 | |
| JP | 2004-39098 A | 2/2004 | |

* cited by examiner

*Primary Examiner*—Thong Q Le
(74) *Attorney, Agent, or Firm*—Sughrue Mion, PLLC

(57) ABSTRACT

In a semiconductor memory device provided with a redundancy circuit for conducting a repair of defective memory cells, the memory cell defects which are unevenly distributed can be efficiently repaired.

The semiconductor memory device has a plurality of memory blocks, and the memory block includes a plurality of segments. A redundancy memory block which substitutes for defective data of a segment is physically provided to each of the plurality of memory blocks. A block address of the redundancy memory block is logically allocated to the plurality of memory blocks in common.

22 Claims, 15 Drawing Sheets

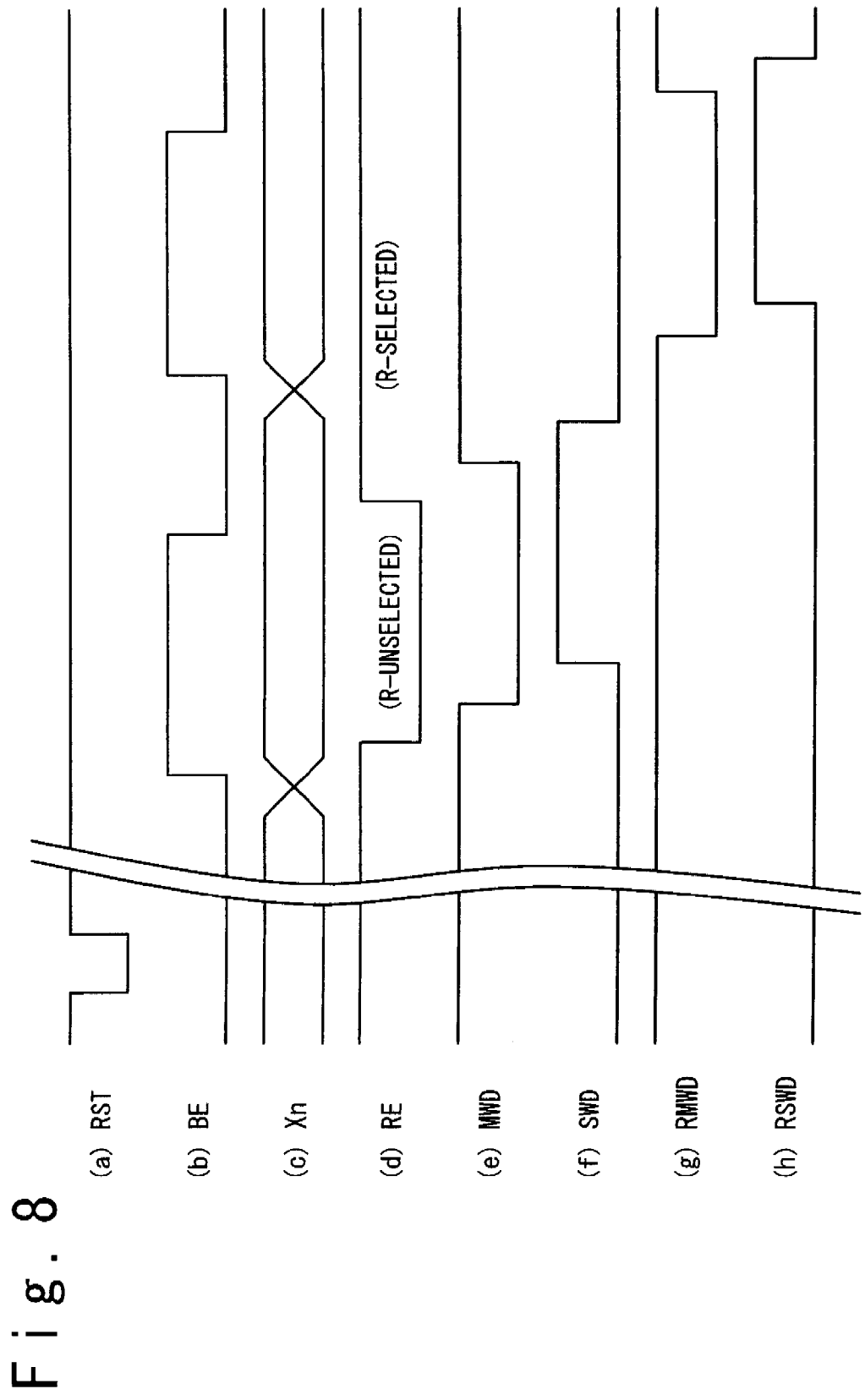

SEMICONDUCTOR MEMORY DEVICE

TECHNICAL FIELD

The present invention relates to a semiconductor memory device, and in particular, relates to a semiconductor memory device having a redundancy circuit that conducts a repair of a defective memory cell.

BACKGROUND ART

In a manufacturing process of a semiconductor memory, a defect is generated on a chip, caused by dust on a surface of a wafer, unevenness in abrasive in polishing the surface of the wafer, and so on. When a small defect is generated on a chip, the chip itself is regarded as a defective product although only a memory cell having the defect portion is defective and other portions operate normally. It is possible to improve a manufacturing yield by providing a spare memory cell on the chip of the semiconductor memory and replacing read/write data for a defective memory cell with data for the spare memory cell. For this reason, it has become popular with the increase in the capacity of the semiconductor memory to provide a redundancy circuit that contains a spare memory cell and a control circuit.

Relationships between a memory cell and a spare memory cell on a chip are now explained with reference to FIG. 1. As shown in FIG. 1A, a memory block 71 has segments 71-0, 71-1, . . . . A segment is a unit which is designated for repairing a defective memory cell when a defect is generated. A redundancy memory block 72 has redundancy segments 72-0 and 72-1 that substitute for the segments including the defective memory cells. When a size of a defect 75 generated in the memory block 71 is small, the defect 75 fits into only the single segment 71-0 of the memory block 71, as in the case of an example shown in FIG. 1A. Information stored in a memory cell group associated with the defect 75 is repaired by the redundancy segment 72-0 in the redundancy memory block 72.

However, as a process scale is miniaturized year by year and the size of the memory cell is reduced, the size of the defect becomes relatively larger in comparison with the size of the memory cell, as shown in FIG. 1B. As a result, the defect does not fit into a single segment but is generated over adjacent successive segments. For this reason, even when the defect 75 having the same size as the defect shown in FIG. 1A is generated, three segments from the segments 73-0 to 73-2 are defective in the example shown in FIG. 1B. Therefore, a redundancy memory block 74 that repairs the defect needs three or more redundancy segments. As described above, a single redundancy segment can repair the defect 75 in the example shown in FIG. 1A. However, in the present day when the process is miniaturized, three redundancy segments are necessary, and defective memory cells concentrates on a specific memory block and is unevenly distributed, as shown in FIG. 1B.

On the other hand, a defective address indicating a memory cell group associated with the defect 75 is held by a redundancy circuit. A fuse is often used for holding the defective address. In the case of FIG. 1A, the fuse holds an address indicative of the segment 71-0 as the defective address. When the memory block 71 is accessed, and when the defective address held by the fuse matches an access address, the segment 72-0 in the redundancy memory block 72 is accessed.

In recent years, address information of a memory is increased due to the increase in the memory capacity. As mentioned above, a capacity of the redundancy memory itself also has to increase. The increase in the capacity of the redundancy memory leads to an increase in the number of fuses which hold the defective addresses.

A configuration of a conventional redundancy memory is described with reference to FIG. 2. As shown in FIG. 2, a system has sub mats 81-0 to 81-7, a sub mat decoder 82 and a column decoder 83, where a redundancy circuit is provided for every sub mats. In general, redundancy circuits are provided in both a row side and a column side. For simplification of the explanation, only the row side is represented in FIG. 2, and the redundancy circuit in the row side will be explained. Here, an address X0 to X13 of 14 bits is inputted as a row address. The address X11 to X13 is used for selecting one of the eight sub mats. The address X3 to X10 is used for selecting one of 256 main word lines MWD of the selected sub mat. The address X0 to X2 is used for selecting one of eight sub word lines SWD. Since eight sub word lines SWD are related to one main word line MWD with regard to word lines, each of the sub mats has 2048 word lines in total (the 256 main word lines×the eight sub word lines). Thus, FIG. 2 shows a memory that has eight spare word lines for the 2048 word lines in each of the sub mats.

The sub mats 81-0 to 81-7 are selected by sub mat selection signals SM0 to SM7 generated by the sub mat decoder 82, respectively. The sub mat 81-0 is provided with a memory cell array 85-0 which is a memory block, a row address decoder 86-0, a redundancy memory cell array 87-0 which is a redundancy memory block, a redundancy row address decoder 88-0, redundancy ROM circuits 91-0-0 to 91-0-7, a sub word decoder 89-0, an AND circuit 93-0, and an OR circuit 94-0. It should be noted that additional numbers attached to reference numerals are given to make a distinction between similar components, and are omitted when the distinction is not necessary. Also, the other sub mats 81-1 to 81-7 have the same configuration as the sub mat 81-0. The only difference is that respective of SM1 to SM7 are inputted as the sub mat selection signals SM. Therefore, description will be given only on the sub mat 81-0, and explanation of the other sub mats 81-1 to 81-7 will be omitted.

In the sub mat 81-0, the memory cell array 85-0 is a group of memory cells of a main body. A memory cell row connected to a word line selected by the row address decoder 86-0 and the sub word decoder 89-0 is activated, and data of the memory cell is amplified by a sense amplifier 84-0. Further, a sense amplifier is selected by a column address decoder 83, and the data is transmitted to an I/O circuit (not shown).

The row address X3 to X10 is inputted to the row address decoder 86-0. The inputted row address is decoded, and one of the 256 main word lines MWD is selected and activated. The sub word decoder 89-0 receives the row address X0 to X2, selects one of the eight sub word lines SWD, and activates the sub word line SWD connected to the activated main word line MWD. Thus, one of the 2048 word lines is activated by the row address decoder 86-0 and the sub word decoder 89-0.

The redundancy memory cell array 87-0 is a redundancy memory for repairing a defective portion of the memory cell array 85-0. A redundancy main word line RMWD in the redundancy memory cell array 87-0 is activated by the redundancy row address decoder 88-0.

The redundancy row address decoder 88-0 decodes a row address in the redundancy memory cell array 87-0. Redundancy selection signals RE outputted from the redundancy ROM circuits 91-0-0 to 91-0-7 is inputted to the redundancy row address decoder 88-0, and a redundancy main word line RMWD is activated. Thus, the redundancy row address decoder 88-0 activates the redundancy main word line RMWD, when any of the redundancy selection signals RE-0-0 to RE-0-7 is activated.

The redundancy ROM circuits 91-0-0 to 91-0-7 hold defective addresses which indicate positions of the defects in the memory cell array 85-0 to be replaced, and determines whether the redundancy memory cell array 87-0 is selected or not. When the redundancy memory cell array 87-0 is selected, the redundancy selection signal RE is activated. With respect to the defective addresses in the memory cell array 85-0, address information corresponding to the row address X0 to X10 are programmed in fuses provided to the redundancy ROM circuits 91-0-0 to 91-0-7. When the memory cell array 85-0 is accessed, the redundancy ROM circuits 91-0-0 to 91-0-7 compare the address information programmed in the fuses with the row address X0 to X10 to be accessed. In a case of match as a result of the address comparison, the redundancy ROM circuits 91-0-0 to 91-0-7 determines that the row address to be accessed is the defective address, and activates the redundancy selection signal RE. In a case of mismatch as a result of the address comparison, the memory cell array of the main body is to be selected, and the redundancy selection signal RE is not activated.

The sub word decoder 89-0 decodes the lower bits X0 to X2 of the row address, activates a sub word line SWD connected to the main word line MWD activated by the row address decoder 86-0, and activates the word line of the memory cell row to be accessed. When a defective address is accessed, the redundancy memory cell array 87-0 instead of the memory cell row specified by the row address should be accessed. It is therefore necessary to invalidate the row address inputted to the sub word decoder 89-0, and to access the redundancy memory cell array 87-0 in accordance with the redundancy selection signal RE outputted from a redundancy ROM circuit holding the defective address among the redundancy ROM circuits 91-0-0 to 91-0-7. For this reason, the sub word decoder 89-0 receives the redundancy selection signals RE-0-0 to RE-0-7 outputted from respective of the redundancy ROM circuits 91-0-0 to 91-0-7. When any of the redundancy selection signals RE-0-0 to RE-0-7 is activated, the sub word decoder 89-0 switches a selector of the sub word decoder 89-0 by using an output of the OR circuit. Also, the sub word decoder 89-0 outputs the redundancy selection signal RE as a signal for selecting the redundancy sub word line RSWD instead of a signal obtained by decoding the lower three bits of the row address.

The AND circuit 93-0 generates a redundancy activation signal BE for activating the redundancy ROM circuits 91-0-0 to 91-0-7. A logical multiplication of the sub mat selection signal SM0 indicating that the sub mat 81-0 is selected and an access activation signal AE indicating that the memory cell is to be accessed is a condition for activating the redundancy ROM circuits 91-0-0 to 91-0-7.

The OR circuit 94-0 receives the redundancy selection signals RE-0-0 to RE-0-7 outputted from the redundancy ROM circuits 91-0-0 to 91-0-7, and outputs a logical addition thereof as a row address decoder killer signal XDK. The row address decoder 86-0 gets into an inactive state, in response to the row address decoder killer signal XDK. Consequently, the memory cell array 85-0 is not activated.

Normal memory access in the above configuration is performed as follows. Here, an operation to read out data stored in the memory cell is explained.

When an access address and an instruction to read data are given, the row address X0 to X13 is validated and the access activation signal AE is activated. The upper row address X1 to X13 is inputted to the sub mat decoder 82, and one of the sub mat selection signals SM0 to SM7 which selects any of the sub mats 81-0 to 81-7 to be accessed is activated. When the row address X11 to X13 is all zero, the row address indicates that the sub mat 81-0 is to be accessed, and the sub mat selection signal SM0 is activated. When the sub mat selection signal SM0 is activated, the AND circuit 93-0 takes the logical multiplication of the access activation signal AE and the sub mat selection signal SM0 to activate the redundancy activation signal BE. The redundancy activation signal BE activates the redundancy ROM circuits 91-0-0 to 91-0-7.

The redundancy ROM circuits 91-0-0 to 91-0-7 store states of the fuses in latch circuits beforehand, at the time of initial setting such as the time of the power activation. Information of the defective addresses held in the latch circuits and the inputted row address X0 to X10 are compared in an address comparator.

In a case of mismatch as a result of the comparison, it is indicated that the memory cell at the address to be accessed has no defect. Therefore, the memory cell array 85-0 is accessed, and the redundancy selection signal RE is not activated. Unless any of the redundancy ROM circuits 91-0-0 to 91-0-7 is activated, the row address decoder killer signal XDK is not activated, and one main word line MWD selected by the row address decoder 86-0 is activated. Similarly, in the sub word decoder 89-0, the output of the OR circuit is not activated, and one sub word line selected based on the row address X0 to X2 is activated. A memory cell row 80 is activated which is connected to a word line selected in accordance with decoding results in the row address decoder 86-0 receiving the row address X3 to X10 and the sub word decoder 89-0 receiving the row address X0 to X2. Data corresponding to the access address is outputted from the memory cell row 80 through the sense amplifier 84-0 selected by the column address decoder 83 to which a column address is supplied.

In a case of match as a result of the comparison, it is indicated that the memory cell at the access address has a defect, and the redundancy memory cell array 87-0 is then accessed. To access the redundancy memory cell array 87-0, a redundancy ROM circuit 91 holding the defective address that matches the access address among the redundancy ROM circuits 91-0-0 to 91-0-7 activates the redundancy selection signal RE. When the redundancy selection signal RE is activated, the OR circuit 94-0 activates the row address decoder killer signal XDK to inactivate the row address decoder 86-0. Consequently, the memory cell array 85-0 is not accessed. The redundancy selection signals RE-0-0 to RE-0-7 are supplied to the redundancy row address decoder 88-0, and a redundancy main word line RMWD in the redundancy memory cell array 87-0 is activated. Since one of the redundancy selection signals RE-0-0 to RE-0-7 inputted to the sub word decoder 89-0 is activated, the selector is switched. Outputted from the sub word decoder 89 is not a signal which selects a sub word line SWD in the memory cell array 85-0 corresponding to the decoding result of the row address X0 to X2 but a signal which selects a redundancy sub word line RSWD specified by the redundancy ROM circuit 91-0.

A memory cell row 92 is activated that is connected to the word line in the redundancy memory cell array 87-0 selected by the redundancy sub word line RSWD specified by the redundancy ROM circuit 91-0. Data corresponding to the access address is replaced by the data of the redundancy memory cell array 87-0 and is outputted from the memory cell row 92 through the sense amplifier 84-0 selected by the column address decoder 83 to which a column address is provided.

In the case of the above example, the number of the fuses holding the defective addresses is eleven per one redundancy ROM circuit 91, which corresponds to the row address X0 to X10 of 11 bits. Also, eight row addresses can be replaced in one sub mat. Therefore, if the defects are detected in 9 or more row addresses in the one sub mat 81, the memory chip cannot be repaired even if there is no defect in the other sub mats 81.

Thus, it is necessary to efficiently conduct a repair by using a redundancy circuit while reducing the chip size by designing circuits dedicated to the redundancy circuit as less as possible. In a case where defects are evenly distributed over a memory block and between memory blocks, it is possible to repair the defective cells by providing redundancy circuits, the number of which is determined stochastically. However, the repair of the defects generated in the memory block is limited by the number of redundancy circuits provided in the block. There is a problem in that the memory chip cannot be repaired when the defective cells concentrate in a particular memory block and the number of addresses to be replaced exceeds the number of redundancy circuits.

Next, a flexible method is explained, which redeems the above-mentioned shortcomings and improves repair efficiency. According to the considered flexible method, a redundancy circuit is not provided for each memory block, but a larger redundancy circuit is provided for a larger memory block. Although the fraction of redundancy circuit size per a memory block is the same, it is possible to repair the defects which are unevenly distributed, since an absolute number of the redundancy circuits handling the memory block is increased.

For example, the redundancy ROM circuit 91 shown in FIG. 2 is replaced by a redundancy ROM circuit 96 shown in FIG. 3. The number of fuses holding the defective addresses is increased by three per a redundancy circuit in comparison with the circuit in FIG. 2, and the access address is compared with the row address X0 to X13. The access activation signal AE is directly supplied to the redundancy ROM circuit 91 such that it is activated whenever any of the sub mats 81-0 to 81-7 is accessed. Then, the redundancy ROM circuit 96 can be used in common in all sub mats 81. In FIG. 2, eight redundancy circuits are provided for each of the sub mats 81-0 to 81-7. According to the redundancy ROM circuit shown in FIG. 3, 64 redundancy circuits shared by respective of the sub mats 81-0 to 81-7 are provided. Thus, even if there are ten defective addresses to be replaced in the sub mat 81-0, the chip can be repaired if there are no defects at all in the sub mats 81-1 to 81-7.

As stated above, the number of fuses holding the defective addresses in the redundancy ROM circuit 96 is fourteen, which corresponds to the row address X0 to X13. Also, the number of defects that can be replaced with in one memory block is 64.

According to the flexible method, although the capability to repair the unevenly-distributed defects is improved, there is a problem that the number of fuses in the redundancy circuit is increased due to the increase in the size of the memory block that is to be replaced.

The size of the fuse is approximately 3 times 60 micrometers, which is very large as compared with the memory cell size being approximately 0.13 square micrometers. Therefore, the number of fuses should be as small as possible. For example, in a case when the memory is divided into $2^n$ memory blocks and m redundancy memory cell rows are provided to each of the memory blocks, the number of the redundancy memory cell rows is $m \times 2^i$. When the bit number of the address which specifies the redundancy memory cell row is X, the number of fuses provided to the redundancy circuit is $(X-n) \times m \times 2^n$ in the former method, and is $X \times m \times 2^n$ in the latter method. For example, as compared with a case where the memory is divided into eight (n=3) and eight redundancy circuits are provided in the former case, extra 192 fuses are necessary in the latter case.

As described above, it is important to reduce the number of fuses, as the memory capacity increases and the memory cell is miniaturized. A method which is the combination of the former and the latter methods is also known (e.g. Japanese Laid Open Patent Application JP-P2001-143494A). According to the method, some of the redundancy circuits are allocated to a divided memory block, and the remaining redundancy circuits are allocated to a plurality of division memory blocks.

Also, Japanese Laid Open Patent Application JP-A-Heisei 5-242693 discloses a technique, in which two column lines in a column direction are simultaneously replaced by a redundancy circuit, the redundancy circuit is composed of two redundancy blocks, two redundancy blocks are selected by lower column addresses, and a ROM circuit (a fuse and a program circuit) of the redundancy circuit is used in common to reduce the fuse area and selection circuit.

DISCLOSURE OF INVENTION

An object of the present invention is to provide a semiconductor memory device that is provided with a redundancy circuit performing a repair of a defective memory cell and can efficiently repair unevenly-distributed memory cell failures.

Another abject of the present invention is to provide a semiconductor memory device having a redundancy circuit in which the number of fuses holding information of defective addresses is reduced.

Also, another object of the present invention is to provide a semiconductor memory device having a redundancy circuit in which an occupied area of fuses holding information of defective addresses is reduced.

Further, another object of the present invention is to provide a semiconductor memory device that can repair defective memory cells which are unevenly distributed and improve the yield.

In an aspect of the present invention, a semiconductor memory device having a redundancy circuit is provided with a plurality of memory blocks and a plurality of redundancy memory blocks provided for each of the plurality of memory blocks. An address bit for selecting each of the plurality of memory blocks is different from an address bit for selecting each of the plurality of redundancy memory blocks.

In the semiconductor memory device of the present invention, one or more adjacent memory cell rows or columns owned by each of the plurality of memory blocks is referred to as a segment which is a unit of allocation as a replacement target. Adjacent segments having defects are replaced by redundancy segments respective of which are provided in different ones of the plurality of redundancy memory blocks.

In the semiconductor memory device of the present invention, address bits that define the segment are lower address bits. Address bits for selecting the plurality of redundancy memory blocks include an address bit immediately above the lower address bits.

In the semiconductor memory device of the present invention, a unit of the segment is equal to the number of sub word lines.

In another aspect of the present invention, a semiconductor memory device has a memory block and a plurality of redundancy memory blocks. The memory block has a plurality of segments, and each of the plurality of segments is provided with a plurality of memory cells. The plurality of redundancy memory blocks are provided for the memory block. Each of the plurality of redundancy memory blocks has a redundancy segment. The redundancy segment substitutes for any segment having a defect of the plurality of segments. The plurality of segments are cyclically and sequentially allocated to the plurality of redundancy memory blocks. When having a defect, each of the plurality of segments can be replaced by the allocated redundancy memory block.

In another aspect of the present invention, a semiconductor memory device has a plurality of memory blocks and a plurality of redundancy memory blocks. Each of the plurality of memory blocks has a plurality of segments, and each of the plurality of segments has a plurality of memory cells. The plurality of redundancy memory blocks are provided for the plurality of memory blocks. Each of the plurality of redundancy memory blocks has a redundancy segment. The redundancy segment substitutes for any segment having a defect of the plurality of segments. The plurality of segments are cyclically and sequentially allocated to the plurality of redundancy memory blocks. When having a defect, each of the plurality of segments can be replaced by the allocated redundancy memory block.

In another aspect of the present invention, in a semiconductor memory device having a plurality of memory blocks, each of the plurality of memory blocks includes a plurality of segments. A redundancy memory block, which substitutes for any segment having a defect of the plurality of segments, is physically provided to each of the plurality of memory blocks. The redundancy memory block is logically allocated to the plurality of memory blocks in common. When having a defect, each of the plurality of segments can be replaced by the allocated redundancy memory block.

In the semiconductor memory device of the present invention, a first segment and a second segment of the plurality of segments are adjacent to each other. A first redundancy memory block allocated to the first segment and a second redundancy memory block allocated to the second segment are different redundancy memory blocks.

In the semiconductor memory device of the present invention, an address indicating the first segment and an address indicating the second segment are successive addresses. A number indicating the first redundancy memory block and a number indicating the second redundancy memory block are cyclically successive.

According to the semiconductor memory device of the present invention, when k is a number indicating the redundancy memory block allocated to any of the plurality of segments, m is an address indicating any of the plurality of segments, and n is the number of the plurality of redundancy memory blocks, the k is given by a remainder generated when the m is divided by the n.

In the semiconductor memory device of the present invention, each of the plurality of segments is a group of memory cells connected to $2^n$ (n=0, 1, 2, ...) word lines or bit lines. When the number of the word lines or the bit lines is plural, the word lines or the bit lines are adjacent.

In the semiconductor memory device of the present invention, a plurality of lower bits of an address inputted to a decode circuit for selecting any of the plurality of segments are also inputted to a decode circuit for selecting any of the plurality of redundancy memory blocks.

According to the present invention, it is possible in a semiconductor memory device provided with a redundancy circuit performing a repair of a defective memory cell to efficiently repair unevenly-distributed memory cell failures.

Also, according to the present invention, it is possible to provide a semiconductor memory device having a redundancy circuit in which the number of fuses holding information of defective addresses for specifying defective memory cells is reduced.

Further, according to the present invention, it is possible to provide a semiconductor memory device having a redundancy circuit in which an occupied area of fuses is reduced, since the number of the fuses holding the information of the defective addresses for specifying the defective memory cells is reduced.

Additionally, according to the present invention, it is possible to repair unevenly-distributed defective memory cells by dispersing the redundancy circuits and to improve yield of the semiconductor memory device.

BRIEF DESCRIPTION OF DRAWINGS

FIG. 8 is a timing chart showing an operation waveform according to the first embodiment of the present invention;

BEST MODE FOR CARRYING OUT THE INVENTION

A semiconductor memory device according to a first embodiment of the present invention will be described with reference to FIGS. 4 to 9. In general, a semiconductor memory device (DRAM) has a redundancy circuit in one of or each of a row side and a column side. In order to simplify the description, the redundancy in the row side will be described below. It is obvious that the present invention is applicable to the redundancy in the column side as well.

In the first embodiment, a segment which is a unit for replacing a defect is a memory cell group connected to one word line selected by a row address. In the present invention, the memory cell group connected to the one word line is referred to as a sub memory block. Therefore, the size of the segment and that of the sub memory block are equal in the first embodiment.

In the first embodiment, memory cell arrays are allocated in a mosaic form to redundancy memory cell arrays. A repair is possible even if failing bits are generated to concentrate on a specific block, and the number of fuses in a redundancy selection circuit is reduced. In other words, redundancy sub memory blocks for unevenly-distributed failures are distributed over the redundancy memory cell arrays. In the conventional technique, the repair may be impossible due to a shortage of the redundancy sub memory blocks when the failing bits are generated with a concentration. According to a configuration of the present embodiment, however, the repair is possible because the sub memory blocks of failing bit group are dispersively allocated to the redundancy memory cell arrays. Such a configuration or method is referred to as a mosaic segment redundancy, since the sub memory blocks in the memory cell array are allocated to the redundancy memory cell arrays in a mosaic form.

Figure 4:
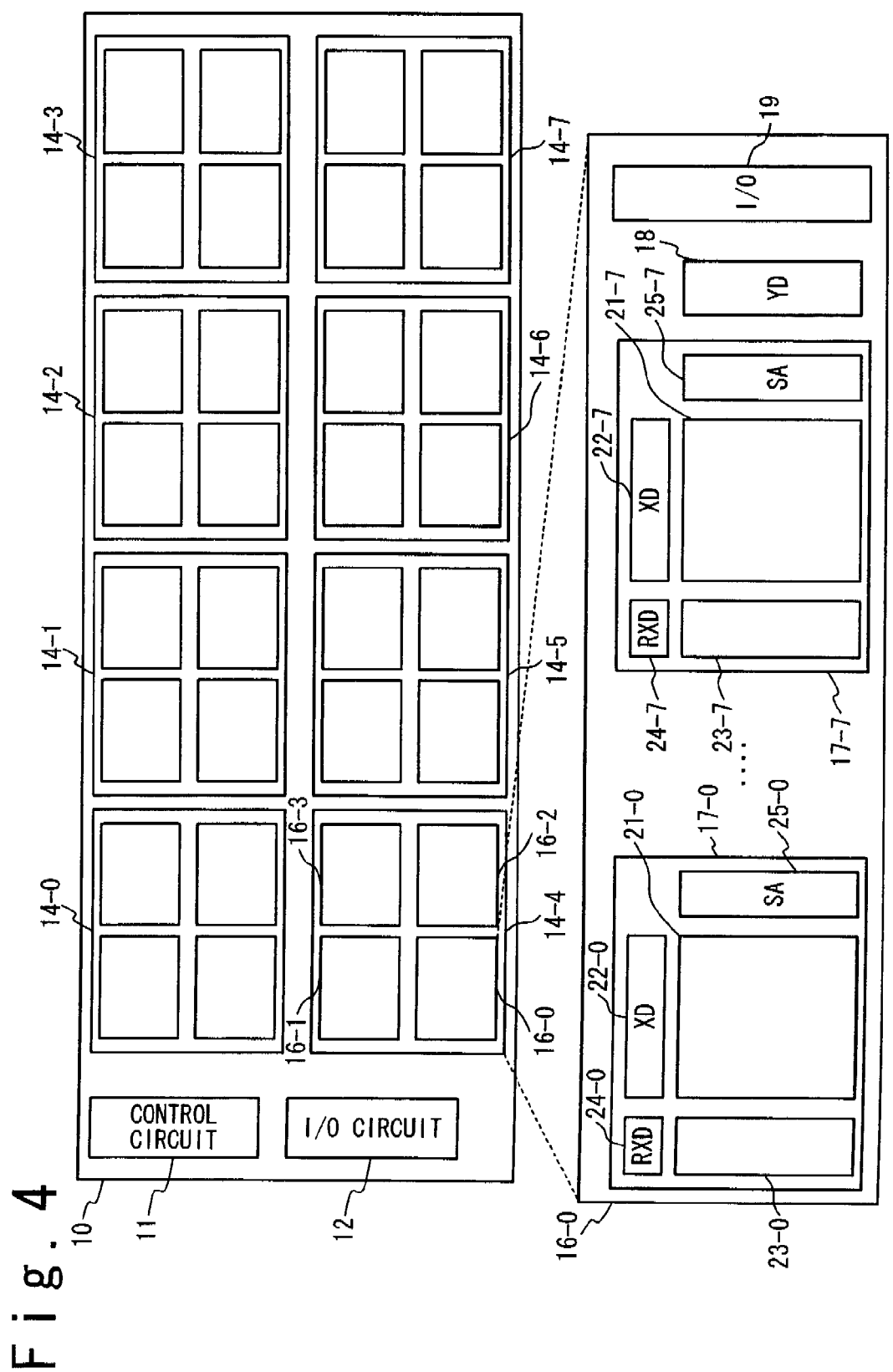
FIG. 4 is a block diagram showing a configuration of a DRAM according to a first embodiment of the present invention.

FIG. 4 is a block diagram showing a configuration of a 1 G bit DRAM provided with a redundancy ROM circuit. A DRAM chip 10 has a control circuit 11, an I/O circuit 12 and banks 14-0 to 14-7. Here, reference numerals with hyphens and additional numbers attached denote the same configurations, and the hyphen and the additional number are omitted when distinction is not particularly necessary.

The control circuit 11 is a circuit for controlling an operation of the DRAM. The control circuit 11 analyzes an input command, outputs a timing signal and a control signal to each section, and performs a normal memory operation corresponding to the command.

The I/O circuit 12 receives an external address signal indicative of a data location, and writes data indicated by a data signal to a memory cell indicated by the address signal, or outputs data read from the memory cell at the address as a data signal.

The bank 14 is a unit in which the memory cell array of each of the banks can be independently activated. The DRAM shown in FIG. 4 has an eight-bank configuration of the banks 14-0 to 14-7. The bank 14 is divided into some sections and controlled. The divided memory cell assembly is referred to as a mat. In the case of FIG. 4, each of the banks 14 is divided into four sections and has mats 16-0 to 16-3.

The mat 16 is further divided into some sections and controlled. The divided memory cell assembly is referred to as a sub mat. In the case of FIG. 4, one mat 16 has eight sub mats 17-0 to 17-7. A column address decoder 18 for decoding a column address (Y address) and an I/O circuit 19 for inputting and outputting data are provided in common to the sub mats. One sub mat is selected from the sub mats 17-0 to 17-7 by using the upper three bits (X11 to X13) of a row address (X address).

The sub mat 17 is a unit having a memory cell array group surrounded by a row address decoder 22 and a sense amplifier 25 (including column SW). The sub mat 17 has a memory cell array 21, the row address decoder 22, a redundancy memory cell array 23, a redundancy row address decoder 24, and the sense amplifier 25.

Figure 2:
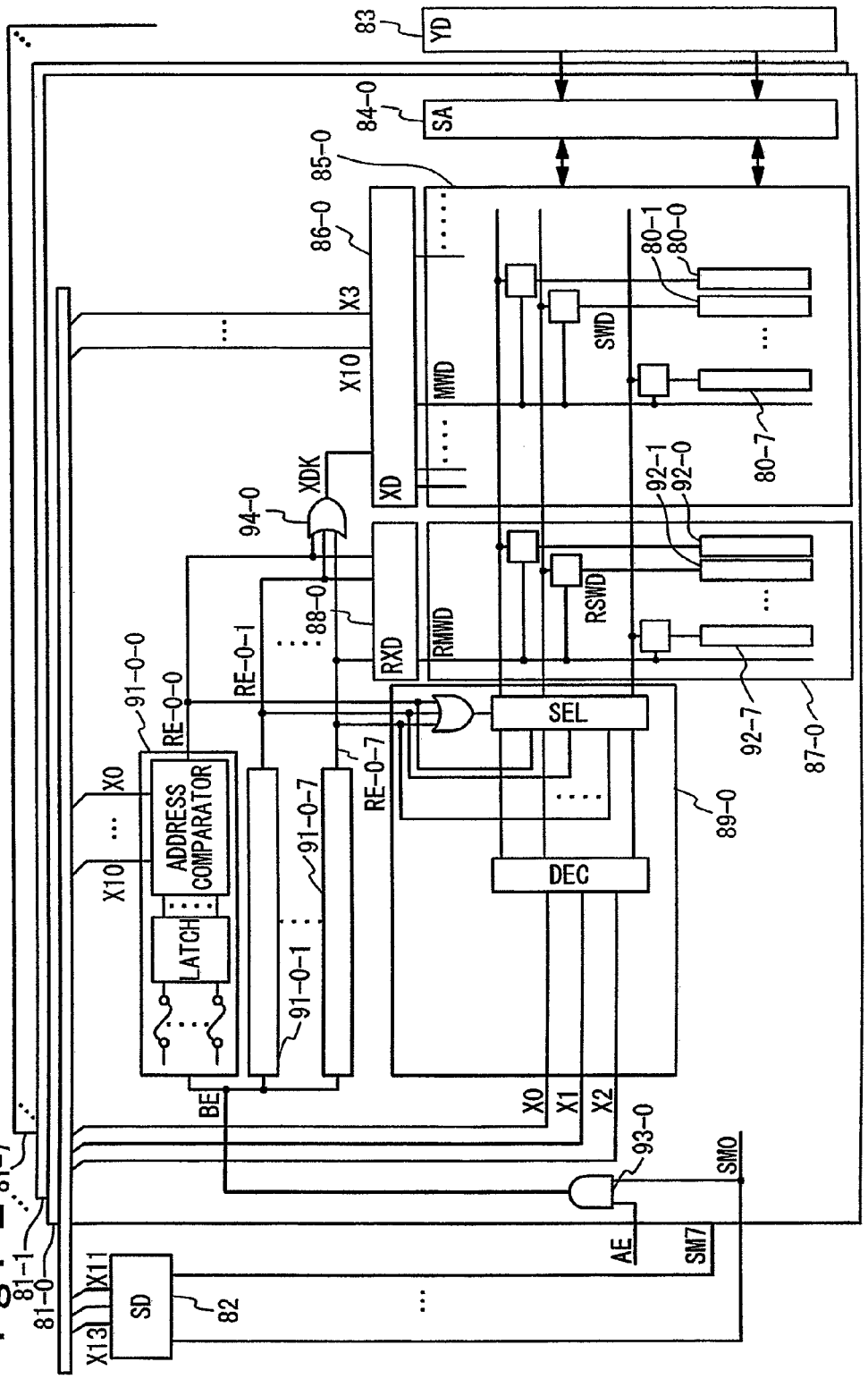
FIG. 2 is a block diagram showing a configuration of a MAT in the conventional technique.
Figure 3:
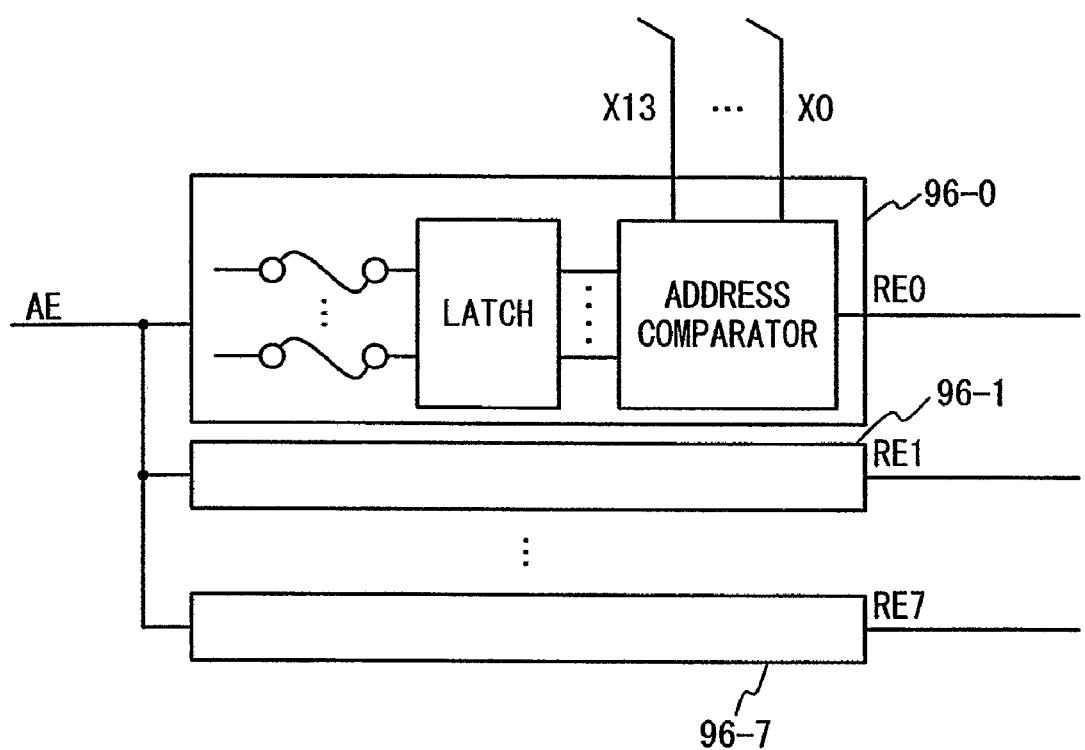
FIG. 3 is a block diagram showing a configuration of a portion of an extended redundancy ROM circuit according to the conventional technique.
Figure 5:
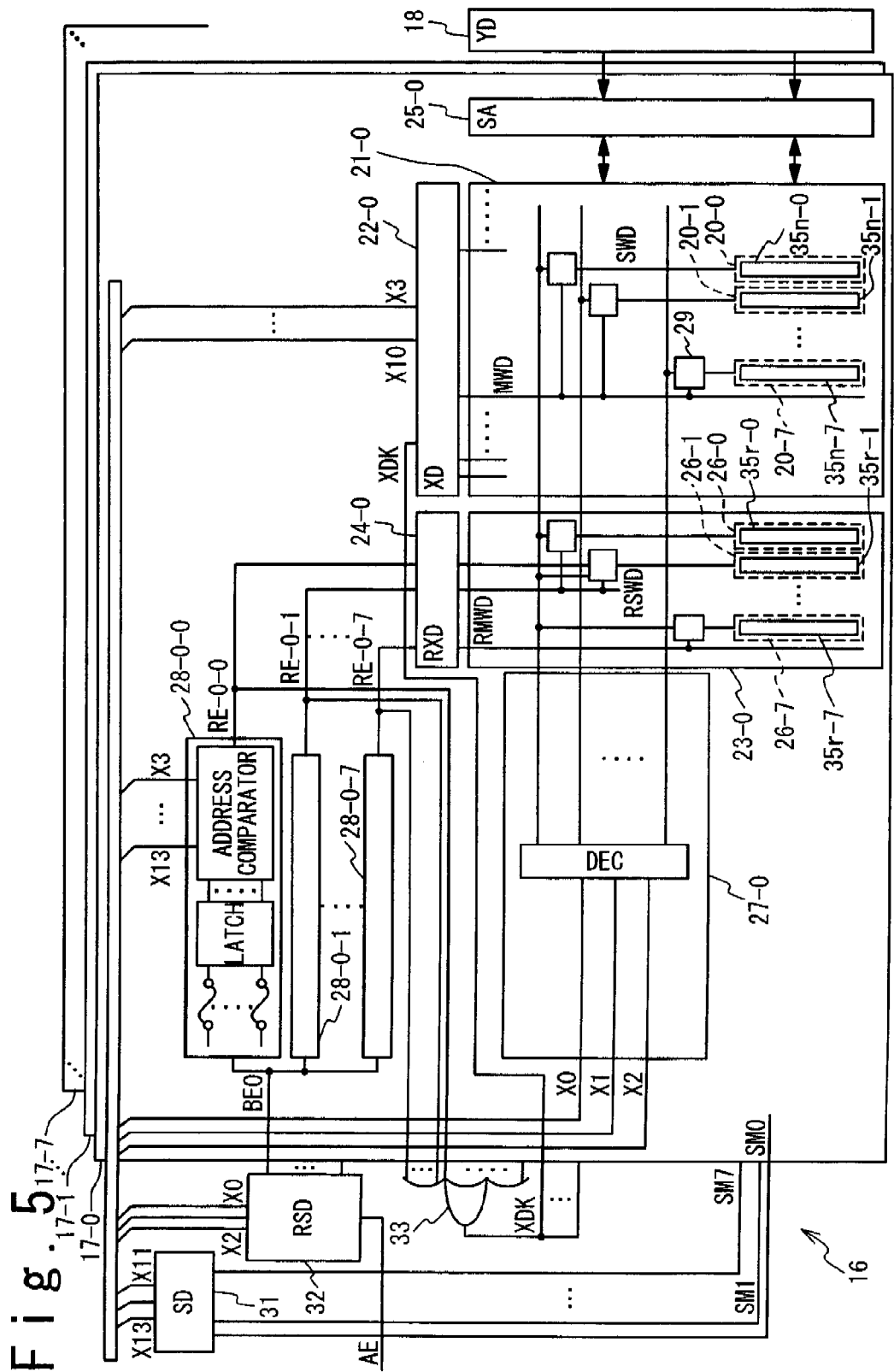
FIG. 5 is a block diagram showing a configuration of a MAT according to the first embodiment of the present invention.

FIG. 5 is a block diagram showing a configuration of the sub mat 17 and the periphery thereof of the mat 16. Description is given below on the mosaic segment redundancy, with reference to FIG. 5. It should be noted that a portion shown in FIG. 5 corresponds to a portion shown in FIG. 2 in which the conventional technique is described, each having the same memory size.

The mat 16 further has a sub mat decoder 31, a redundancy sub mat decoder 32, and an OR circuit 33 as common circuits of each sub mat in addition to the column address decoder 18 and the I/O circuit 19. The mat 16 further has the eight sub mats 17-0 to 17-7.

The sub mat decoder 31 is a decoder for selecting the sub mats 17-0 to 17-7 based on the upper bits of the row address. The sub mat decoder 31 receives and decodes the row address X1 to X13, and outputs sub mat selection signals SM0 to SM7. The sub mat selection signals SM0 to SM7 are supplied to respective of the sub mats 17-0 to 17-7, and the corresponding sub mat 17 is activated.

The redundancy sub mat decoder 32 selects redundancy ROM circuits 28 in the sub mat 17 based on the lower bits of the row address. Supplied to the redundancy sub mat decoder 32 are the row address X0 to X2 and an access activation signal AE which is activated when the mat 16 is to be activated. Redundancy activation signals BE0 to BE7 obtained by decoding the row address X0 to X2 are outputted to the redundancy ROM circuits 28 of the sub mats 17-0 to 17-7, respectively. In this manner, the redundancy ROM circuits 28 are activated by the redundancy activation signal BE independently of the sub mat selection signal SM.

The OR circuit 33 collects from the sub mats 17-0 to 17-7 eight redundancy selection signals RE-n-0 to RE-n-7 outputted from respective of the redundancy ROM circuits 28 in the sub mat 17. The logical sum of the collected 64 redundancy selection signals RE is outputted as a row address decoder killer signal XDK. The row address decoder killer signal XDK is supplied to the sub mats 17-0 to 17-7 to inactivate the row address decoders 22-0 to 22-7. In this case, the memory cell arrays 21-0 to 21-7 are not activated.

The column address decoder 18 selects one of the sense amplifiers 25-0 to 25-7 based on the column address (Y address), and activates the selected one.

The sub mat 17-0 is provided with the memory cell array 21-0, the row address decoder 22-0, the redundancy memory cell array 23-0, the redundancy row address decoder 24-0, a sub word decoder 27-0, the redundancy ROM circuits 28-0-0 to 28-0-7, and the sense amplifier 25-0. The other sub mats 17-1 to 17-7 have the same configurations as the sub mat 17-0, and the sub mat selection signal SM and the redundancy activation signal BE are supplied to each of the sub mats. For this reason, description is given below on the sub mat 17-0, and is omitted on the other sub mats 17-1 to 17-7.

In the memory cell array 21-0, the memory cells are arranged in a matrix form. The memory cells are selected by the row address decoder 22-0, the sub word decoder 27-0, and the column address decoder 18. The memory cell array 21-0 has 2048 word lines in a row direction. One word line is selected by outputs of the row address decoder 22-0 and the sub word decoder 27-0, and a sub memory block 35n which is a memory cell group (row) connected to the selected word line is activated. In the present embodiment, the sub memory block 25n is a segment 20 which is a unit replaced when a defect occurs in the memory cell.

The row address decoder 22-0 decodes the row address (X address) of the memory cell array 21-0. The row address to be decoded is the row address X3 to X10 among the row address X0 to X10 in which the upper three bits for selecting the sub mat 17-0 are excluded. The lower three bits X0 to X2 of the row address are decoded by the sub word decoder 27-0. The input row address X3 to 10 is decoded, and one of the 256 main word lines MWD is activated.

The redundancy memory cell array 23-0 is a redundancy memory block for replacing the data when the memory cell array has a defect. The redundancy memory cell array 23-0 has eight word lines and eight redundancy sub memory blocks 35r connected to respective of the word lines. In the present embodiment, the unit for the replacement of the defective portion is a sub memory block corresponding to one word line, and so eight redundancy segments 26 are provided. The redundancy selection signals RE-0-0 to RE-0-7 are decoded by the redundancy row address decoder 24-0, and a redundancy main word line RMWD of the redundancy memory cell array 23-0 is activated. When the redundancy main word line RMWD is activated, one of the redundancy sub memory blocks 35r-0 to 35r7 is selected. The selected redundancy sub memory block substitutes for one of the sub memory blocks 35n having a defect generated in the memory cell array 21. That is to say, the segment 20 having the defect is replaced by the redundancy segment 26.

The redundancy row address decoder 24-0 receives the redundancy selection signals RE-0-0 to RE-0-7 outputted from the redundancy ROM circuits 28-0-0 to 28-0-7, and activates the redundancy main word line RMWD of the corresponding redundancy memory cell array 23-0. In the case of FIG. 5, the redundancy memory cell array 23-0 has eight redundancy main word lines RMWD corresponding to respective of the redundancy ROM circuits 28-0-0 to 28-0-7. When any of the redundancy selection signals RE-0-0 to RE-0-7 is activated, the redundancy row address decoder 24-0 activates one corresponding redundancy main word line RMWD.

The sub word decoder 27-0 decodes the lower three bits X0 to X2 of the row address to select one sub word line SWD and activate the selected sub memory block 35n. The sub word line SWD is driven by a sub word driver 29 receiving a signal decoded by the sub word decoder 27-0 and the main word line MWD, and selects the sub memory block. As compared with the sub word decoder 89 of the conventional technique shown in FIG. 2, the sub word decoder 27 of the present invention has a simplified configuration, since a selector for switching a signal that selects the sub word line SWD is unnecessary and the redundancy selection signal RE is not input. Consequently, it is also possible to reduce the delay time due to the signal switching and to increase the operation speed. Alternatively, the sub word decoder 27-0 may have the same configuration as the conventional technique shown in FIG. 2. In this case, the number of the redundancy main word line is one, and the main word line and the sub word line of the redundancy memory cell array 23-0 are switched by the selector.

The redundancy ROM circuits 28-0-0 to 28-0-7 hold defective addresses for specifying the defective memory cells of the memory cell arrays 21-0 to 21-7 in the mat 16, and determines whether or not to select the redundancy memory cell array 23-0. The redundancy selection signals RE-0-0 to RE-0-7 are activated when the redundancy memory cell array 23-0 is selected. The defective addresses of the memory cell arrays 21-0 to 21-7 correspond to the row address X3 to X13 including the address for selecting the sub mat, and are programmed into the fuses provided in the redundancy ROM circuits 28-0-0 to 28-0-7. At the time of an initial operation, the defective address held in the fuses is latched by a latch circuit. In normal read/write operations, when the redundancy activation signal BE0 is inputted, the input row address X3 to X13 and the defective address held in the latch circuit are compared in an address comparator. In a case of match as a result of the comparison, the input row address X3 to X13 is regarded as the defective address, and the redundancy selection signal RE is activated. In a case of mismatch, the redundancy selection signal RE is not activated. Eight redundancy ROM circuits 28 are provided to the sub mat 17-0, and hold a maximum of eight defective addresses for specifying the defective memory cells.

The sense amplifier 25-0 is a sense amplifier for reading data from the memory cells of the memory cell array 21-0 and the redundancy memory cell array 23-0. The sense amplifier is selected by the column address decoder 18. The output of the selected sense amplifier 25 is outputted as data stored in the memory.

As described above, when the row address is supplied to the sub mat decoder 31, the row address decoder 22, the sub word decoder 27 and the redundancy sub mat decoder 32, the allocation relationship between the memory cell array 21 and the redundancy memory cell array 23 is determined. The redundancy memory cell arrays 23-0 to 23-7 are provided for the memory cell arrays 21-0 to 21-7 in the eight sub mats 17-0 to 17-7, respectively. Each of the memory cell arrays 21 has a configuration in which an array of eight sub word lines selected by the sub word decoder 27 receiving the row address X0 to X2 is repeated for 256 times. The 256 arrays of the eight sub word lines are selected by the row address decoder 22 for decoding the row address X3 to X10.

On the other hand, the redundancy sub mat decoder 32 selects the sub mat based on the row address X0 to X2. The redundancy memory cell array used for the replacement is arranged in the selected sub mat. Therefore, the array of the eight sub word lines and eight sub mats are related to each other with the same row address X0 to X2. That is, respective of the sub memory blocks 35n connected to the eight sub word lines are allocated sequentially to eight redundancy memory cell arrays. Furthermore, since the array of the eight sub word lines is repeated by the row address X3 to X10, the array is also allocated cyclically and sequentially to the redundancy memory cell arrays.

In addition, the same redundancy memory cell array 23-m (m=0 to 7) is recurrently allocated to every eight sub memory block 35-n (n=0 to 2047). In other words, the sub memory block 35n-n that satisfies the condition of n=8×A+m, is allocated to the redundancy memory cell array 23-m (m=0 to 7). Here, the A is a value determined by the row address X3 to X10, and is an address indicative of the main word line according to the present embodiment. That is to say, the sub memory blocks 35n allocated to a redundancy memory cell array 23-x (redundancy memory block) all has the same sub word line number indicated by the row address X0 to X2.

Figure 6:
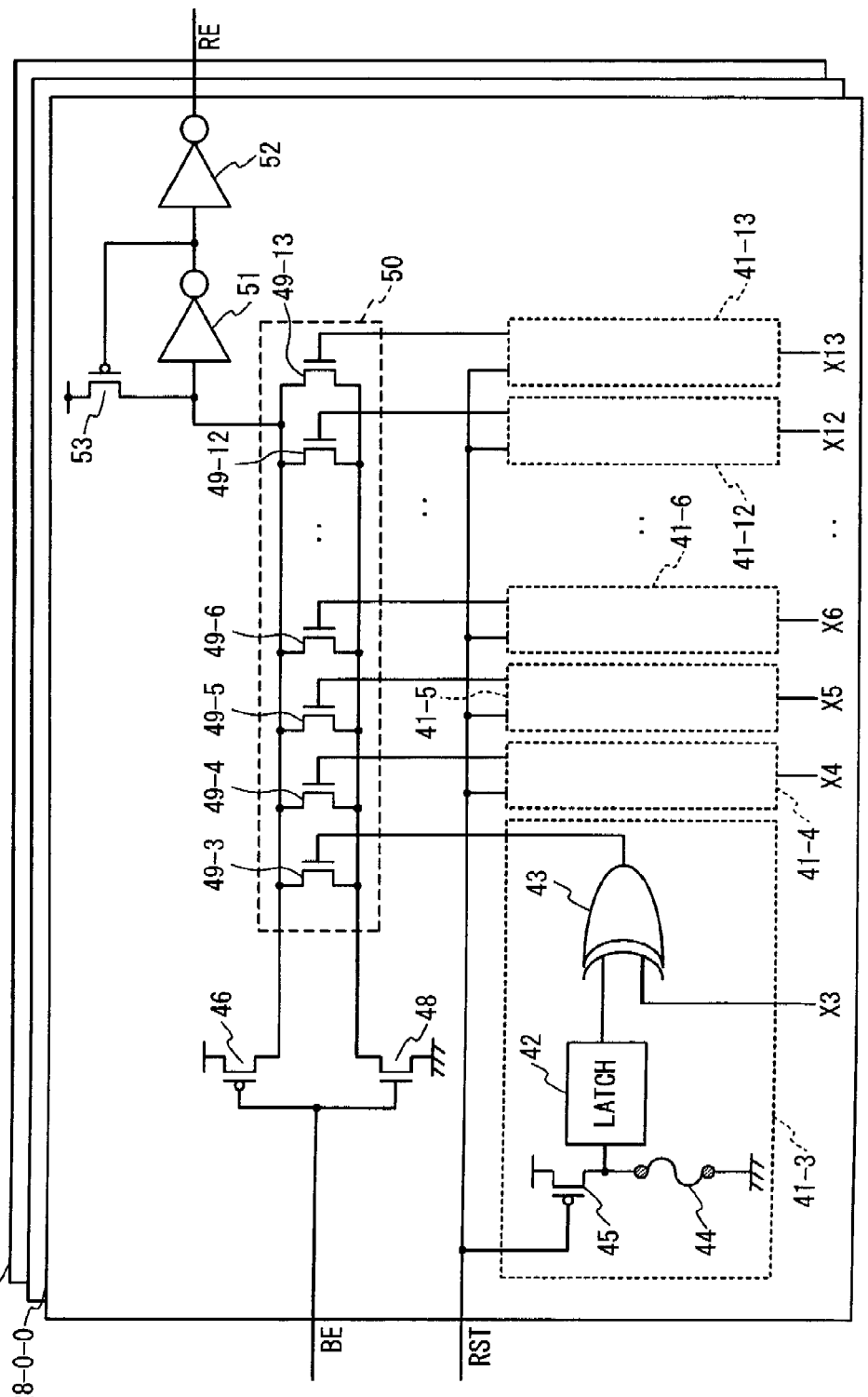
FIG. 6 is a block diagram showing a configuration of a redundancy ROM circuit according to the first embodiment of the present invention.

Next, the redundancy ROM circuit is explained. FIG. 6 is a block diagram showing a configuration of the redundancy ROM circuits 28-0-0 to 28-0-7 provided in the sub mat 17-0. Since the redundancy ROM circuits 28-0-0 to 28-0-7 have the same configuration, description is given below by using the reference numeral 28. The redundancy ROM circuit 28 has redundancy fuse circuits 41-3 to 41-13, a NOR circuit 50 constituted by N-type MOS transistors 49-3 to 49-13, a P-type MOS transistor 46, an N-type MOS transistor 48, inverter circuits 51 and 52, and a P-type MOS transistor 53.

Each of the redundancy fuse circuits 41-3 to 41-13 has a fuse 44, a P-type MOS transistor 45, a latch circuit 42, and an exclusive OR circuit 43. The fuse 44 holds information of one bit of the defective address specifying the defective memory cell. The P-type MOS transistor 45 precharges the fuse 44 in response to a reset signal RST. The latch circuit 42 holds a result of precharging the fuse 44. The information of one bit of the defective address held by the latch circuit 42 and one bit of the input address signal X3 to X13 are compared with each other by the exclusive OR circuit 43. In a case of mismatch, the exclusive OR circuit 43 activates the output to the NOR circuit 50.

The P-type MOS transistor 46 and the N-type MOS transistor 48 drives the NOR circuit 50 in response to the redundancy activation signal BE for activating the address comparison. When the redundancy activation signal BE is in an inactive state, the P-type MOS transistor 46 is turned on and precharges the NOR circuit 50. When the redundancy activation signal BE is activated, the N-type MOS transistor 48 is turned on, sources of the N-type MOS transistors 49-3 to 49-13 are grounded, and the output to the inverter circuit 51 is determined by the result of the address comparison outputted from the redundancy fuse circuits 41-3 to 41-13. When address mismatch is detected in any of the redundancy fuse circuits 41-3 to 41-13, the output of the redundancy fuse circuit 41 activates the N-type MOS transistor 49, and discharges a precharged potential. Therefore, only when the compared addresses are all matched and the outputs from the redundancy fuse circuits 41 are all inactivated, the input of the inverter circuit 51 is activated, which indicates that the addresses are matched.

The inverter circuits 51 and 52 and the P-type MOS transistor 53 form a latch circuit and hold the output of the NOR circuit 50. The output of the inverter circuit 52 is outputted from the redundancy ROM circuit 28 as the redundancy selection signal RE for selecting the redundancy memory at the time of activation.

In such a configuration, one redundancy ROM circuit 28 has eleven fuses 44 in correspondence to the row address X3 to X13.

Figure 7A:
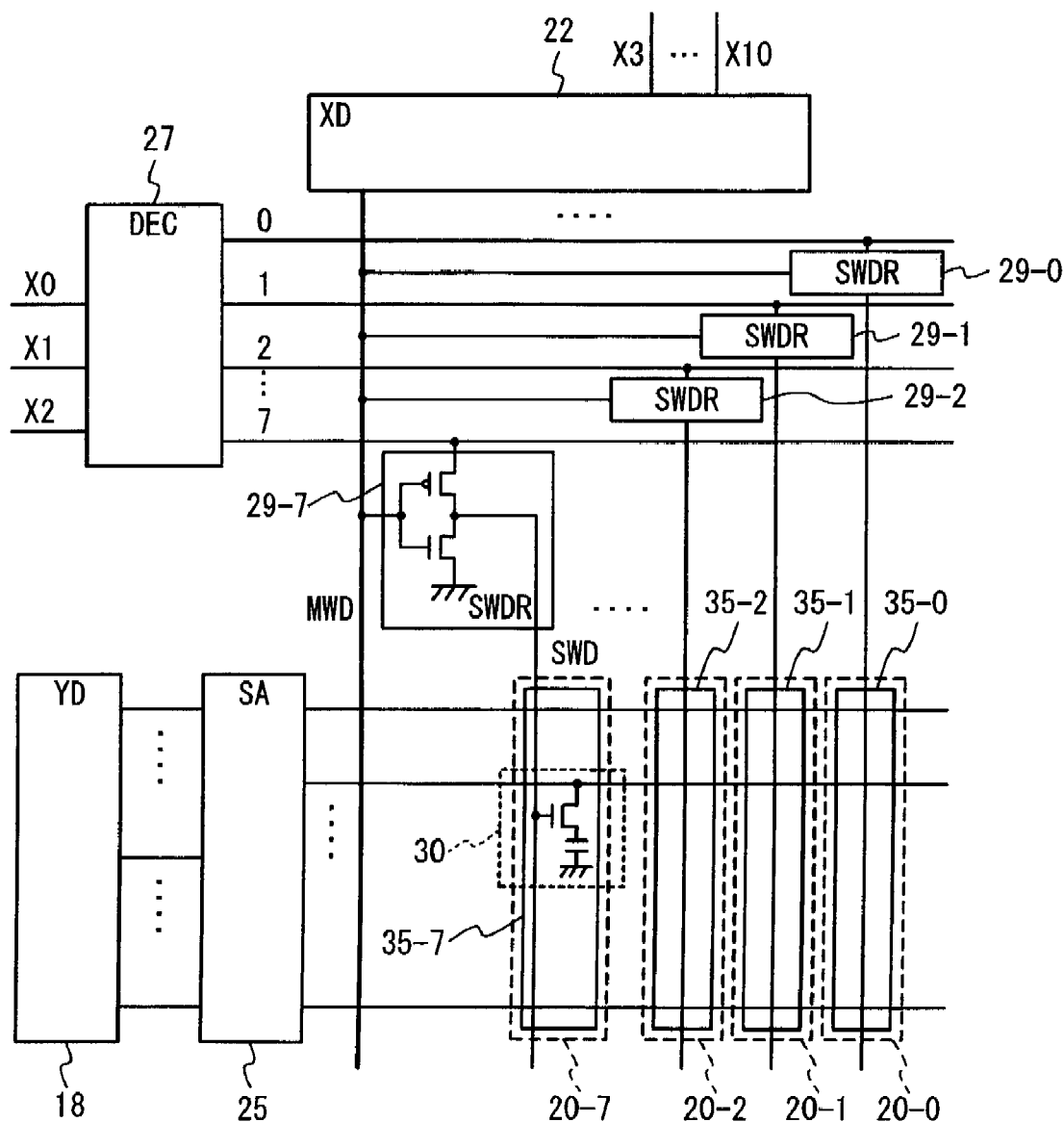
FIG. 7A is a block diagram showing a relationship between a main word line MWD and a sub word line SWD in a memory cell array according to the first embodiment of the present invention.

Next, the main word line and the sub word line are described. FIG. 7A is a figure for explaining a relationship between the main word line MWD and the sub word line SWD in the memory cell array 21. The row address X3 to X10 is decoded by the row address decoder 22, and one of the main word lines MWD is activated. Since the row address to be inputted has eight bits, one of 256 main word lines MWD is activated.

The row address X0 to X2 is decoded by the sub word decoder 27, and one of eight lower row address decode signals is activated. As shown in FIG. 7A, the sub word drivers 29-0 to 29-7 are arranged at respective of intersections between eight lower row address decode signal lines and main word lines MWD.

The sub word driver 29 inputs intersecting main word line MWD and the lower row address decode signal, and activates the sub word line SWD. The sub word driver 29 functions as a switch constituted by a P-type MOS transistor and an N-type MOS transistor. When the main word line MWD is activated, the P-type MOS transistor is turned on, and a status of the lower row address decode signal is reflected to the sub word line SWD. When the main word line MWD is inactive, the N-type MOS transistor is turned on, and the sub word line SWD gets into the inactive state. Therefore, the sub word line SWD is activated when both the main word line MWD and the lower row address decode signal are in the active state. Thus, one sub word line SWD is selected by the row address X0 to X10.

When the sub word line SWD is activated, memory cells connected to the sub word line SWD is activated. For example, when the sub word line SWD outputted from the sub word driver 29-7 is activated, a sub memory block which is a memory cell group connected to the sub word line SWD is activated. In the present embodiment, the sub memory block is the segment as the unit for the replacement of the memory cell having a defect, and the segment 20-7 is activated. The sub memory blocks 35-0 to 35-7 have memory cells as indicated by the reference numeral 30 at every intersections between the sub word lines SWD and the bit lines. The status of the memory cell to be activated appears in the bit line intersecting with the sub word line SWD. Data stored in the activated memory cell is read by the sense amplifier 25 selected by the column address decoder 18. Also, data inputted from the outside is written into the activated memory cell.

Figure 7B:
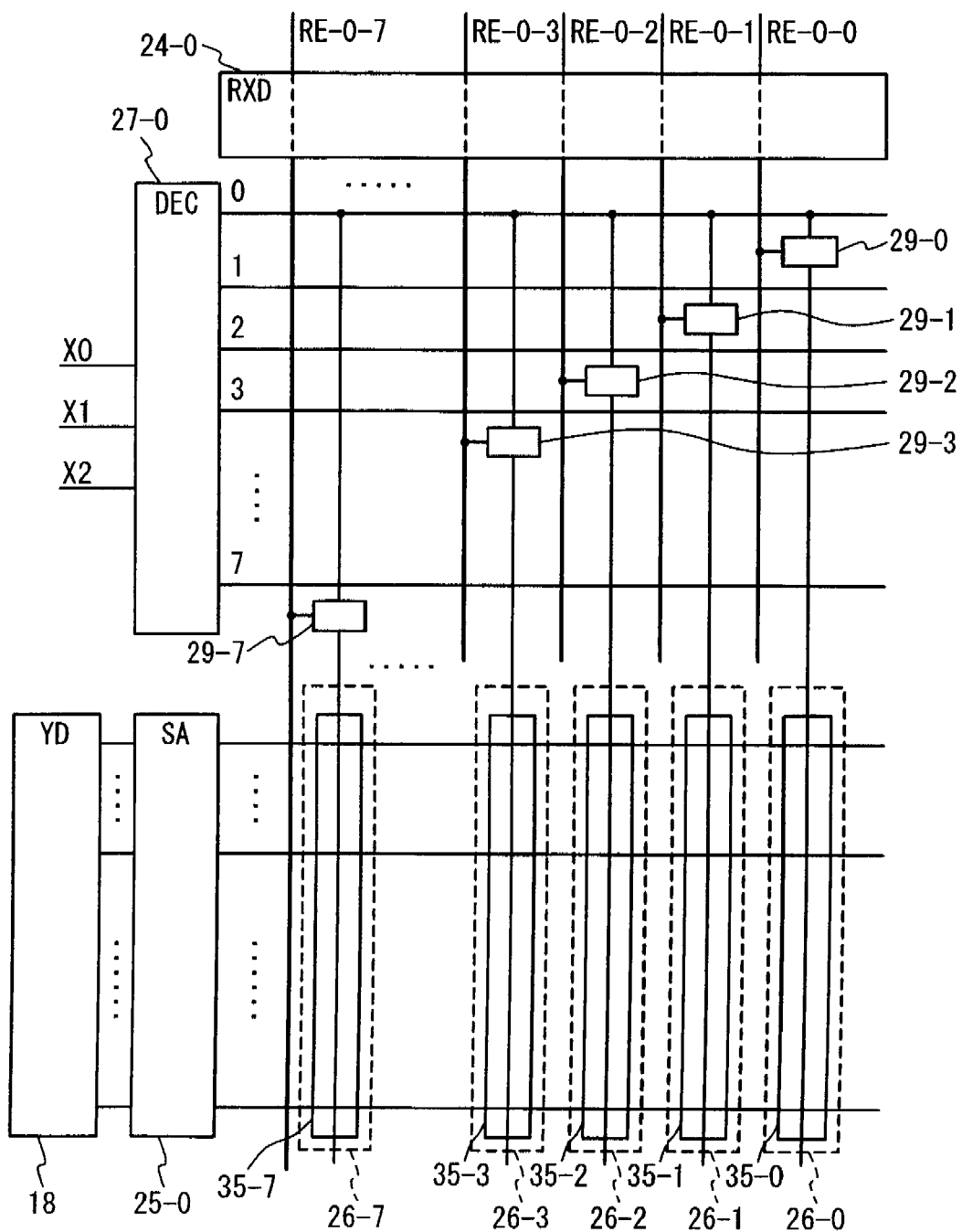
FIG. 7B is a block diagram showing a relationship between a main word line MWD and a sub word line SWD in a redundancy memory cell array according to the first embodiment of the present invention.

In the redundancy memory cell array 23, a relationship between the redundancy main word line RMWD and the redundancy sub word line RSWD is similar to the relationship between the main word line MWD and the sub word line SWD in the memory cell array 21. FIG. 7B shows a relationship in the sub mat 17-0. In the redundancy row address decoder 24, address information to be inputted is not the row address but the redundancy selection signals RE-0-0 to RE-0-7 outputted from the redundancy ROM circuits 28-0-0 to 28-0-7. Also, in the present embodiment, the number of the redundancy main word lines RMWD is eight in correspondence to the redundancy selection signals RE-0-0 to RE-0-7. Each of the redundancy main word lines RMWD corresponds to one redundancy sub word line RSWD.

The redundancy row address decoder 24-0 receives the redundancy selection signals RE-0-0 to RE-0-7, and activates the redundancy main word line RMWD that corresponds to the redundancy selection signals RE-0-0 to RE-0-7. On the other hand, the sub word decoder 27-0 receives the row address X0 to X2, and outputs eight decode signals. All the sub word driver 29-0 to 29-7 are connected to a decode signal "0" corresponding to all the row address X0 to X2 being "C" among the eight decode signals. Thus, in the sub mat 17-0, the sub word driver 29 is connected to a signal corresponding to the row address X0 to X2 being "0", while in the sub mat 17-$n$, the sub word driver 29 is connected to a decode signal corresponding to the row address X0 to X2 being "n". According to the sub word driver 29 thus connected, when the redundancy main word line RMWD is activated in the sub mat 17-0, the redundancy sub word line RSWD is activated only when the lower three bits X0 to X2 of the row address are "0". The status of the memory cell of the redundancy memory cell array 23 appears at the bit line intersecting with the redundancy sub word line RSWD. Since the activation of the memory cell array 21 is prohibited by the row address decoder killer signal XDK, data stored in the redundancy memory cell is read by the sense amplifier 25 selected by the column address decoder 18, and data inputted from the outside is written. In the sub mat 17-1 to 17-7 as well, the redundancy sub word line RSWD is activated and a defect is repaired when the lower three bits (X0 to X2) of the row addresses indicate respective of "1" to "7" and the redundancy selection signal RE is activated.

FIG. 8 shows a time chart describing an operation. The reset signal RST as shown in (a) section of FIG. 8 is inputted from the control circuit 11 after the power-on. When the reset signal RST is inputted, the P-type MOS transistor 45 shown in FIG. 6 is activated, and a voltage is applied to the fuse 44 that holds the defective address identifying the defective memory cell. A voltage level inputted to the latch circuit 42 varies based on blowing/not-blowing of the fuse 44. The latch circuit 42 holds the state of the fuse.

The voltage level that corresponds to the blowing/not-blowing differs depending on the type of fuse element. In a case of a melting type, the voltage level becomes high in the case of blowing, while becomes low in the case of not-blowing. Also, in a case of a type in which an insulating film is destroyed, the voltage level becomes low in the case of blowing (destruction), while becomes low in the case of not-blowing (non-destruction). The voltage level applied to the fuse 44 is held by the latch circuit 42, and the address held in the latch circuit 42 is used for the address comparison at the time of normal memory read/write memory access.

As shown in the first half of FIG. 8, when both the redundancy activation signal BE ((b) section) and the row address Xn ((c) section: X3 to X13) are inputted to the redundancy ROM circuit, the address comparison is carried out.

If the access address does not match defective address specifying the defective memory cell, the redundancy selection signal RE ((d) section) is not activated. If all the redundancy selection signals RE are not activated, the row address decoder killer signal XDK is not activated. The row address decoder 22-0 becomes effective, the main word line MWD is activated ((e) section: Low level), and thereby the corresponding sub word line SWD is activated ((f) section: High level). Also, the redundancy main word line RMWD for accessing the redundancy memory cell array is inactive ((g) section: High level), and the corresponding redundancy sub word line RSWD is also inactive ((h) section: Low level). In this case therefore, the memory cell in the memory cell array 21-0 is accessed.

As shown in the second half of FIG. 8, both the redundancy activation signal BE ((b) section) and the row address Xn ((c) section: X3 to X13) are inputted to the redundancy ROM circuit. When the row address Xn matches the defective address specifying the defective memory cell, the redundancy selection signal RE ((d) section) is activated. When the redundancy selection signal RE is activated, the row address decoder killer signal XDK is generated in the OR circuit 33, and the row address decoder 22-0 is inactivated. Thus, the main word line MWD is inactivated ((e) section: High level), and the sub word line SWD remains inactive ((f) section: Low level) even if the output of the sub word decoder 27-0 is activated. The redundancy main word line RMWD ((g) section) of the redundancy memory cell array 23-0 is activated because the redundancy selection signal RE is activated. The redundancy sub word line RSWD that corresponds to the output of the sub word decoder 27-0 is activated ((h) section: High level), and the corresponding memory cell in the redundancy memory cell array 23-0 is accessed.

Figure 1A:
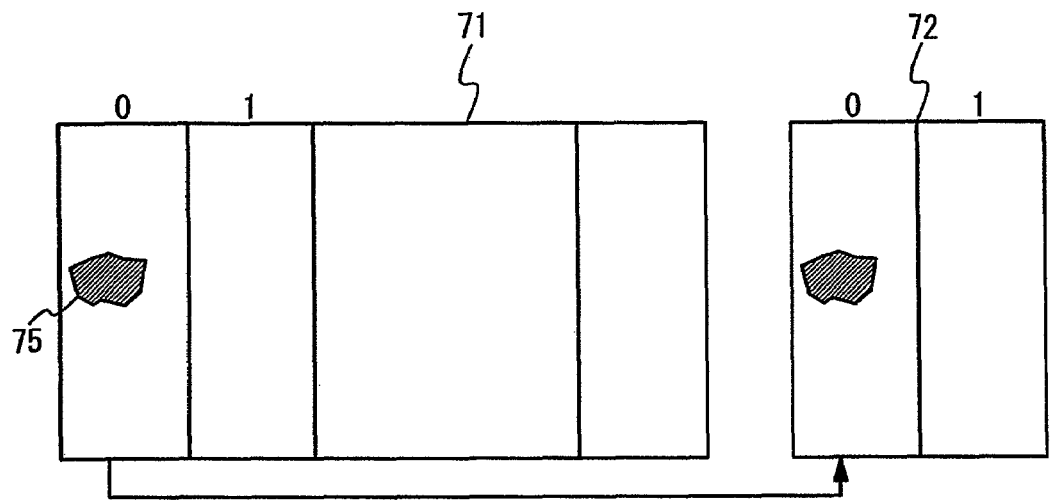
FIG. 1A is a diagram showing a relationship between a defective segment and a redundancy memory block according to a conventional technique.
Figure 1B:
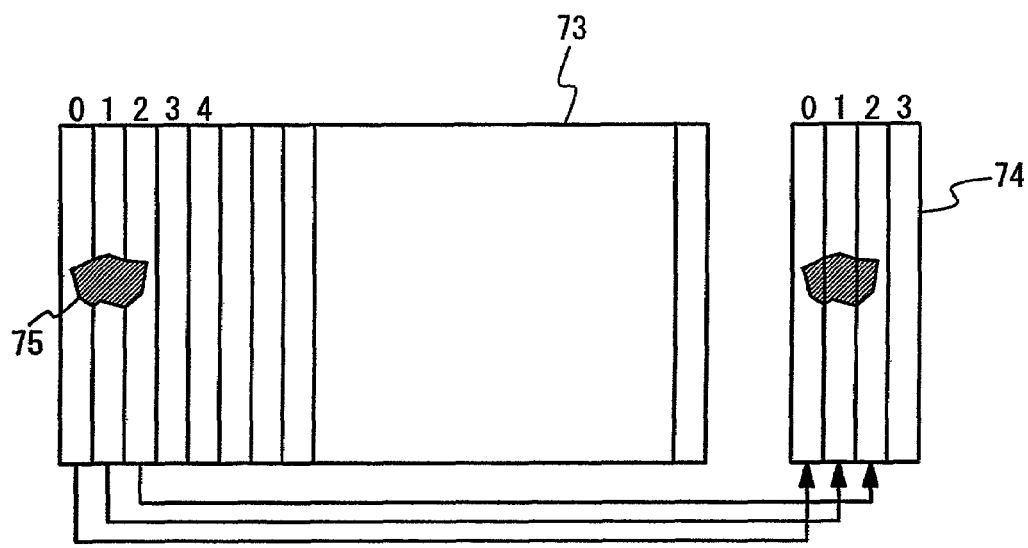
FIG. 1B is a diagram showing a relationship between defective segments and a redundancy memory block according to a conventional technique.
Figure 9:
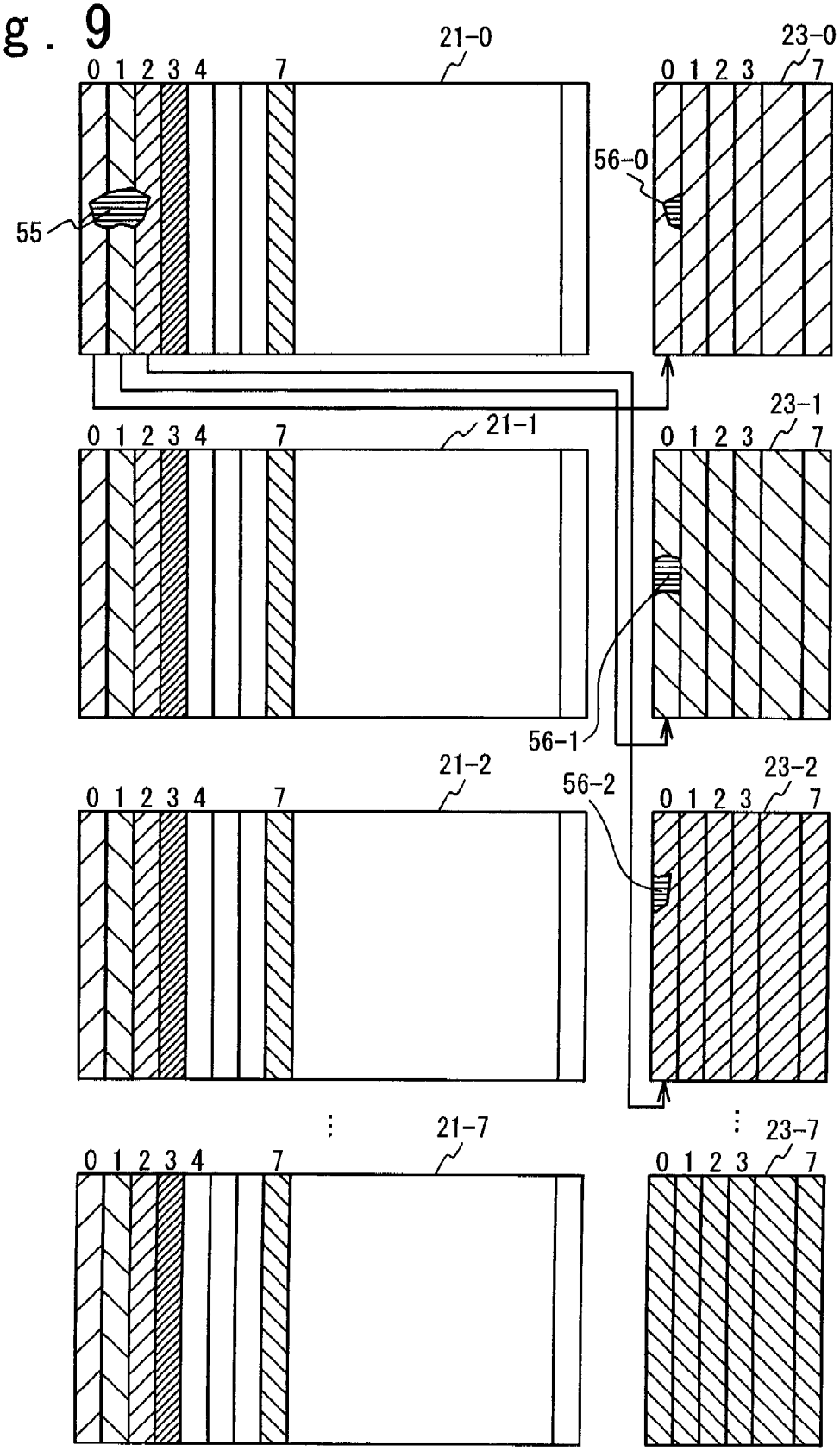
FIG. 9 is a diagram showing a relationship between a sub word and a redundancy ROM circuit according to the present invention.

Description is given on the allocation relationship between the memory cell and the redundancy memory cell array when a defect occurs. According to the mosaic segment redundancy, when a defective memory cell group 55 is generated in the memory cell array 21-0 as shown in FIG. 9, the redundancy memory cell arrays 23-0 to 23-2 are allocated in accordance with the defective memory cell group 55. In the redundancy memory cell arrays, respective portions indicated by the reference numerals 56-0 to 56-2 correspond to the defective memory cell group 55. According to the conventional technique shown in FIG. 1B, the defect generated in the three segments are repaired by using the three segments in the redundancy memory block 74. When the present invention is applied, as shown in FIG. 9, the repair is possible by using the redundancy memory cell arrays 23-0-0, 23-1-0 and 23-2-0 which are the redundancy segments in respective of the redundancy memory cell arrays 23-0 to 23-2 as the redundancy memory blocks.

Shown in FIG. 9 is the replacement of the defect generated in the memory cell group connected to the three successive sub word lines, namely, the three sub memory blocks. Description is given on a case where a defect is generated over further successive sub word lines, e.g. where a memory cell group is defective, the memory cell group being connected to twelve successive sub word lines of the successive sub word lines 0 to 7 corresponding to one main word line and the sub word lines 0 to 3 corresponding to the next main word line in the memory cell array 21-0. According to the conventional method in which the memory cell array 21-0 is related to the redundancy memory cell array 23-0, the repair is impossible because the number of the redundancies in the redundancy cell array 23-0, which is eight, is insufficient. According to the present invention, a defect generated in the memory cell array 21-0 is repaired by the redundancy memory cell arrays 23-0 to 23-7. The segments having the defect in the memory cell array 21-0 are sequentially allocated to the redundancy memory cell arrays 23-0 to 23-7. Two redundancy word lines are used in each of the redundancy memory cell arrays 23-0 to 23-3, and one redundancy word line is used in each of the redundancy memory cell arrays 23-4 to 23-7. Thus, the repair is possible. Therefore, a redundancy memory having high repair efficiency can be configured with the same number of redundancy memories and fuses as that of the redundancy circuit of the conventional technique.

According to the mosaic segment redundancy, the number of fuses in the redundancy circuit holding the defective address specifying the defective memory cell is eleven corresponding to the row address X3 to X13, and the repair of the defective memory cell is possible by using these fuses. In order to repair the same defect by using the flexible method of the conventional technique, fourteen fuses that correspond to the row address X0 to X13 are necessary as the fuses for holding the defective address, since it is judged whether or not the access row address matches the defective address specifying the defective memory cell. As described above, a concentrated defect repaired by using fourteen fuses in the conventional flexible method can be repaired by using eleven fuses when the present invention is applied. Thus, the number of fuses can be reduced.

The present embodiment has been described by using the memory cell group connected to one word line as the segment; however, there is no limitation to the one word line. If a range can be specified by one address and it is a unit which can be replaced by the redundancy memory, the range may be used as the segment. Also, the redundancy for the word line (row address) has been described. It is obvious that the present invention can be applied to redundancy for the bit line (column address) as well.

Figure 10:
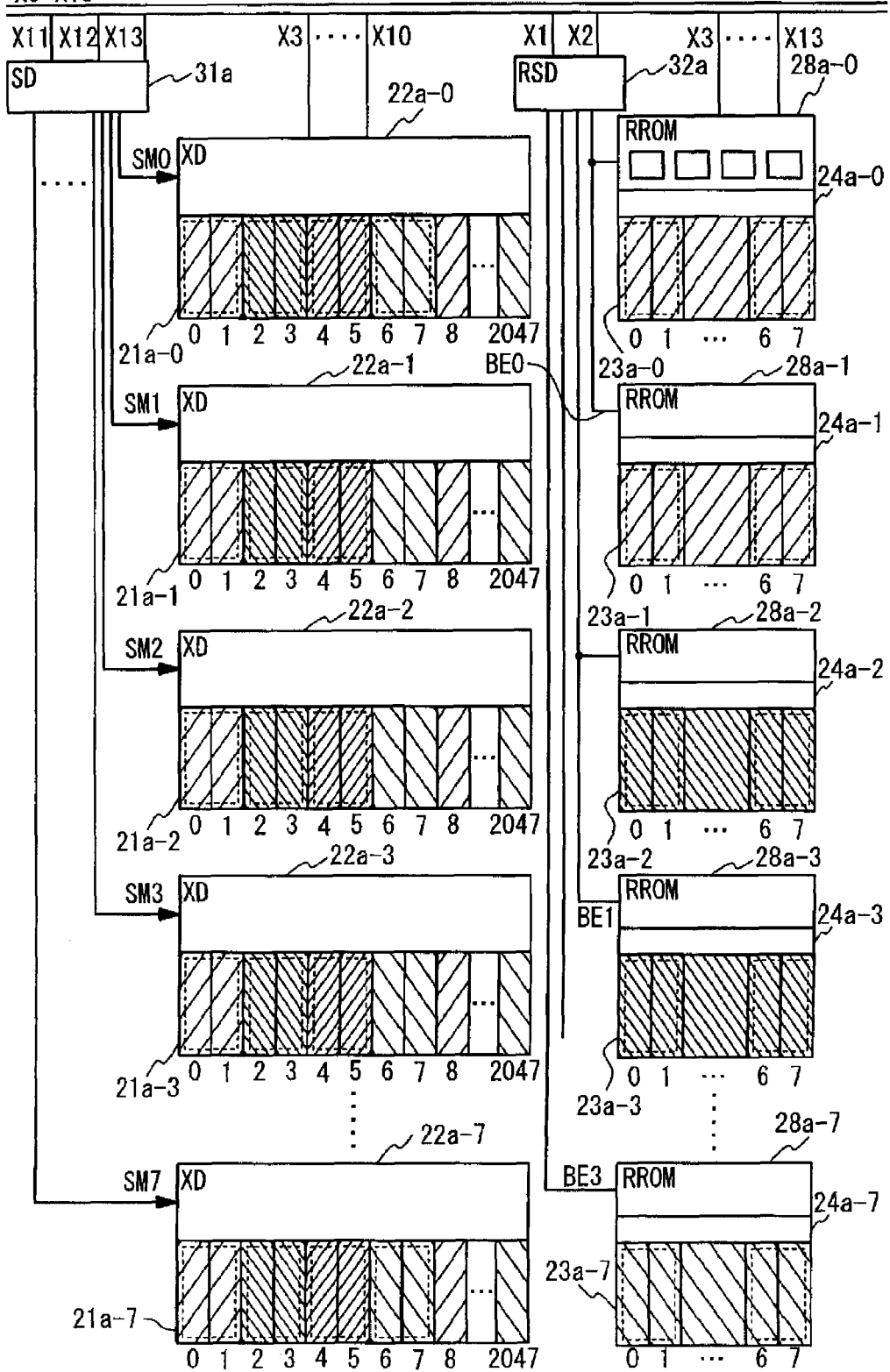
FIG. 10 is a block diagram showing a configuration of the second embodiment according to the present invention.

Referring next to FIG. 10, description is given on a semiconductor memory device according to the second embodiment of the present invention. In the second embodiment, the defect of a memory cell group corresponding to a plurality of sub words is repaired as a segment which is a repair unit. As compared with the first embodiment, the number of fuses used for holding a defective address specifying a defective memory cell can be further reduced. FIG. 10 shows a case where a memory cell group associated with two sub words is a segment and a defect is replaced. The same applies to a unit of more than two sub words. As compared with the case in the first embodiment, the number of fuses holding the defective address specifying the defective memory cell is reduced by half, since the defect is replaced in units of two sub words. Here, description is given on an allocation relationship between a memory cell array 21a and a redundancy memory cell array 23a in a row address. Therefore, only a portion that is relevant to the row address, the address decoder and the memory cell array is shown, and the other portions are omitted. Additionally, the redundancy for the word line (row address) is described below, which is obviously applicable to the redundancy for the bit line (column address) as well.

A DRAM has a sub mat decoder 31a, memory cell arrays 21a-0 to 21a-7, row address decoders 22a-0 to 22a-7, redundancy memory cell arrays 23a-0 to 23a-7, redundancy row address decoders 24a-0 to 24a-7, redundancy ROM circuit groups 28a-0 to 28a-7 each having four redundancy ROM circuits, and a redundancy sub mat decoder 32a. A sub word decoder not shown receives the row address X0 to X2. A method of selecting words in the memory cell array is the same as in the first embodiment, and word selecting in the redundancy memory cell array is described with reference to FIG. 7C.

The sub mat decoder 31a receives the row address X11 to X13, and outputs the sub mat selection signals SM0 to SM7 to respective sub mats. The row address decoders 22a-0 to 22a-7 of each of the sub mats receive the row address X3 to X10, the sub word decoder receives the row address X0 to X2, and one of 2048 word lines of each of the memory cell arrays 21a-0 to 21a-7 is activated. The memory cell arrays 21a-0 to 21a-7 of each of the sub mats are activated by the corresponding sub mat selection signals SM0 to SM7 from the sub mat decoder 31a, and output data of the memory cell that corresponds to the row address decoders 22a-0 to 22a-7 and the activated word line. The redundancy sub mat decoder 32a receives the row address X1 and X2, and outputs four redundancy activation signals BE0 to BE3. The four redundancy activation signals BE0 to BE3 are supplied to the redundancy ROM circuit groups 28a-0 and 28a-1, 28a-2 and 28a-3, 28a-4 and 28a-5, and 28a-6 and 28a-7, respectively. Therefore, two redundancy ROM circuit groups are activated by one redundancy activation signal BE. The redundancy ROM circuit group 28a-n (n=0 to 7) receives the row address X3 to X13, and outputs a comparison result with the defective address specifying the defective memory cell, as the redundancy selection signals RE-n-0 to RE-n-3, to the redundancy row address decoder 24a-n. The redundancy row address decoder 24a-n receives the redundancy selection signals RE-n-0 to RE-n-3, and activates the redundancy main word line RMWD of the redundancy memory cell array 23a-n (n=0 to 7). A redundancy ROM circuit provided to the redundancy ROM circuit group 28a-n is related to two sub word lines of the redundancy memory cell arrays 23a-0 to 23a-7. Therefore, two sub word drivers 29 are connected to one redundancy main word line RMWD. The redundancy memory cell arrays 23a-0 to 23a-7 each have four main word lines driven by the redundancy row address decoders 24-0 to 24-7, and output the data of the memory cell connected to the sub word line activated by the sub word driver 29.

Each of the memory cell arrays 21a-0 to 21a-7 has 2048 word lines, and one word line is selected by the row address decoders 22a-0 to 22a-7 receiving and decoding the row address X0 to X10 and the sub word decoder. When all the redundancy ROM circuits 28a determine that the accessed address does not match the defective address, a relevant memory cell row among the memory cells arrays 21a-0 to 21a-7 is accessed. When any of the redundancy ROM circuits 28a determines that the accessed address matches the defective address, the row address decoder killer signal is activated, and the row address decoders 22a-0 to 22a-7 are invalidated. Therefore, the memory cells of the memory cell arrays 21a-0 to 21a-7 are not accessed.

The redundancy sub mat decoder 32a decodes the row address X1 and X2, and outputs four redundancy activation signals BE0 to BE3. One redundancy activation signal BE selects two redundancy ROM circuit groups (28a-0 and 28a-1, or 28a-2 and 28a-3, or 28a-4 and 28a-5, or 28a-6 and 28a-7). Therefore, each of the redundancy ROM circuit groups 28a-0 and 28a-1, 28a-2 and 28a-3, 28a4 and 28a-5, and 28a-6 and 28a-7, can be regarded as one redundancy RON circuit group and can be considered as a memory having four redundancy memories.

The redundancy memory cell arrays 23a-0 to 23a-7, each having eight word lines, are redundancy memory blocks for replacing the data at the defective address specifying the defective memory cell in the memory cell arrays 21a-0 to 21a-7. Eight word lines of the redundancy memory cell array 23a-n corresponds in pairs to respective of the redundancy selection signals RE-n-0 to RE-n-3 outputted from the redundancy ROM circuit group 28a-n (n=0 to 7). The redundancy selection signals RE-n-0 to RE-n-3 each activates one redundancy main word line RMWD by the redundancy row address decoder 24a-n (n=0 to 7). One redundancy main word line is connected to two sub word drivers 29, and one redundancy sub word line RSWD is selected by the row address X0. The row address X0 is not inputted to the redundancy sub mat decoder 32a, and one of the redundancy ROM circuits activated by the outputted redundancy activation signal BE is related to two word lines. Therefore, the two word lines correspond to two adjacent word lines in the memory cell arrays 21a-0 to 21a-7.

Here, description is given on a relationship between the main word lines and the sub word lines in the redundancy memory cell arrays 23a-0 to 23a-7, and on an allocation relationship between the sub memory block having a defect in the memory cell arrays 21a-0 to 21a-7 and the redundancy sub memory block in the redundancy memory cell arrays 23a-0 to 23a-7 for replacing the sub memory block. The relationship between the main word lines and the sub word lines in the memory cell arrays 21a-0 to 21a-7 was described in the first embodiment by referring to FIG. 7A. Since the same applies to the present embodiment, description is omitted. Description is made on the relationship between the main word lines and the sub word lines in the redundancy memory cell arrays 23a-0 to 23a-7 with reference to FIG. 7C. FIG. 7 shows the redundancy memory cell array 23a-0 in the sub mat 17-0, and relevant redundancy row address decoder 24a-0, sub word decoder 27a-0, sense amplifier 25-0, and column address decoder 18.

The redundancy row address decoder 24a-0 receives the redundancy selection signals RE-0-0 to RE-0-3, and activates one redundancy main word line RMWD that corresponds to the activated redundancy selection signal RE among four redundancy main word lines RMWD corresponding to the redundancy selection signals RE-0-0 to RE-0-3. The sub word decoder 27a-0 outputs eight decode signals activated in accordance with the row address X0 to X2. In the redundancy memory array 23a-0, the sub word driver 29 activates the redundancy sub word line RSWD based on the activated decode signal and the redundancy main word line RMWD, and a sub memory block 35 which is the memory cell group connected to the redundancy sub word line RSWD is activated. The sense amplifier 25-0 is selected by the column address decoder 18 based on the column address. Data stored in the activated memory cell is read by the sense amplifier 25-0, and data inputted from the outside is written thereto.

Figure 7C:
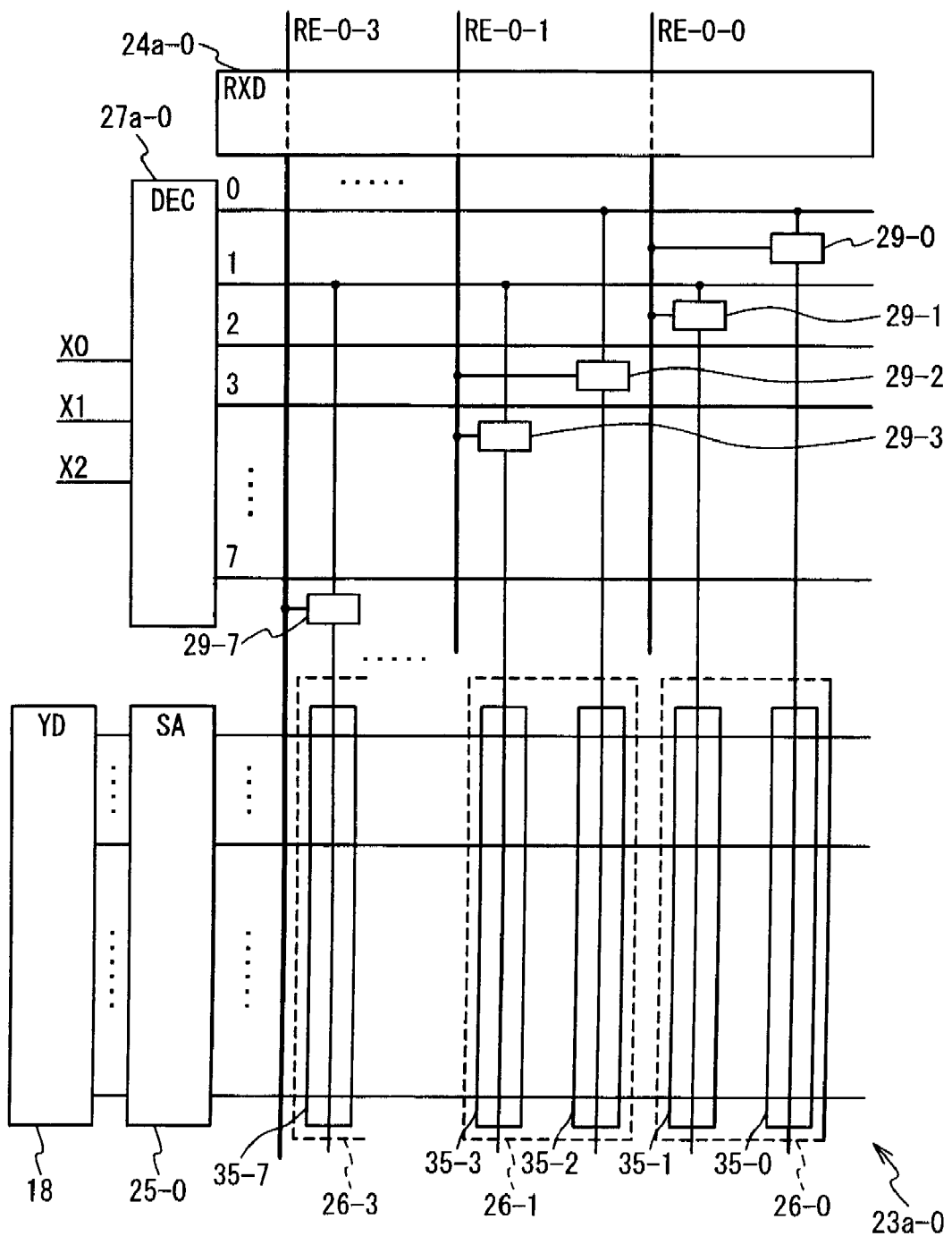
FIG. 7C is a block diagram showing a relationship between a main word line MWD and a sub word line SWD in a redundancy memory cell array according to second and third embodiments of the present invention.

The sub word decoder 27a-0 outputs eight decode signals activated based on the row address X0 to X2. The sub word drivers 29-0 to 29-7 are arranged at intersections between the decode signal lines and the redundancy main word lines. The sub word drivers 29-0 to 29-7 each activates one redundancy sub word line RSWD, based on the redundancy main word line RMWD and the decode signal. FIG. 7C shows the redundancy memory cell array 23a-0 arranged in the sub mat 17-0, where the sub word drivers 29-0, 2, 4, and 6 receive decode signals activated when the row address X0 to X2 is "0", and the sub word drivers 29-1, 3, 5, and 7 receive decode signals activated when the row address X0 to X2 is "1". Such connection makes it possible to specify a sub memory block in the segment. In the case of other sub mats, the sub word drivers 29-0, 2, 4, and 6 receive decode signals activated when the row address X0 to X2 is "2×n", and the sub word drivers 29-1, 3, 5, and 7 receive decode signals activated when the row address X0 to X2 is "2×n+1" (n=0, 1, 2, and 3), in the redundancy memory cell array 23-(2×n) and the redundancy memory cell array 23-(2×n+1).

The segment in such a configuration corresponds to two sub memory blocks, the segment being an allocation unit for repairing the defect of the memory cell array by using the redundancy memory array. Therefore, the sub memory blocks 35-0 and 35-1 are allocated as a redundancy segment 26-0; the sub memory blocks 35-2 and 35-3 are allocated as a redundancy segment 26-1; the sub memory blocks 35-4 and 35-5 are allocated as a redundancy segment 26-2; and the sub memory blocks 35-6 and 35-7 are allocated as a redundancy segment 26-3, wherein the allocated redundancy segment substitutes for the defect generated in two adjacent sub words of the memory arrays 21-0 to 21-7. The allocated redundancy segment repairs the defect by substituting for one sub memory block of the memory cell arrays 21a-0 to 21a-7 having the defect and being accessed.

An operation when the memory is accessed is described. When the memory is accessed, the redundancy ROM circuit groups 28a-0 to 28a-7 are activated in combinations of 28a-0 and 28a-1, 28a-2 and 28a-3, 28a-4 and 28a-5, and 28a-6 and 28a-7 simultaneously. Each of the redundancy ROM circuit groups 28a-0 to 28a-7 has four redundancy ROM circuits 28a-n-0 to 28a-n-3 (n=0 to 7), and compares the defective address specifying the defective memory cell held in the fuses of each circuit and the input row address X3 to X13. In the case of match, the row address X3 to X13 is determined to be the defective address, and one redundancy selection signal RE is activated. The redundancy main word line and the sub word line are selected, the redundancy main word line corresponding to the activated redundancy selection signal RE-n-m outputted from the redundancy ROM circuit 28a-n-m (n=0 to 7, m=0 to 3) holding the defective address. Then, the redundancy memory cell array 23a-n is activated, and all the memory cell arrays 21a-0 to 21a-7 are inactivated. Therefore, the redundancy memory cell array 23a is accessed instead of the memory cell array 21a, and the defect of the memory cell array 21a is replaced by the redundancy memory cell array 23a. In the case of mismatch, the accessed address is regarded not to be the defective address specifying the defective memory cell, and the memory cell array 21a is activated and normal access is performed.

Each of the redundancy ROM circuits 28a-0 to 28a-7, when activated by the redundancy activation signals BE0 to BE3, compares the defective address specifying the defective memory cell held in the fuse and the input row address X3 to X13. Therefore, the row address X1 to X13 is compared with the defective address, and the memory cells that belong to two adjacent sub words corresponding to the row address X0 are the target of replacement (segment).

Thus, the segment which is the allocation unit for replacing the defect is two sub memory blocks. In the memory cell array 21a-0 selected by the row address X0 to X10, the memory cell arrays 21a-0-0 and 21a-0-1 are allocated to the redundancy memory cell array 23a-0 or 23a-1, the memory cell arrays 21a-0-2 and 21a-0-3 are allocated to the redundancy memory cell array 23a-2 or 23a-3, the memory cell arrays 21a-0-4 and 21a-0-5 are allocated to the redundancy memory cell array 23a-4 or 23a-5, the memory cell arrays 21a-0-6 and 21a-0-7 are allocated to the redundancy memory cell array 23a-6 or 23a-7, and the memory cell arrays 21a-0-8 and 21a0-9 are allocated to the redundancy memory cell array 23a-0 or 23a-1. Thus, the segments are cyclically allocated in order. In other words, the memory cell arrays 21a-0-0 to 21a-0-2047 are repeatedly allocated in units of two sub memory blocks, to the pairs of the sub memory blocks (23a-0 and 23a-1, 23a-2 and 23a-3, 23a-4 and 23a-5, and 23a-6 and 23a-7) of the redundancy memory cell arrays, in accordance with the row address X1 and X2.

Further, in the memory cell arrays 21a-1 to 21a-7, as in the case of the memory cell array 21a-0, the memory cell arrays 21a-i-(2×m) and 21a-i-(2×m+1) are allocated sequentially to the redundancy memory cell array 23a-(2×n) or 23a-(2×n+1) (i=1 to 7, m=0 to 1023, n=0 to 3, m is the number of segments provided to the memory cell array, n is given by a reminder generated when m is divided by 4 as the number of the redundancy memory blocks).

In other words, the following description is possible. The redundancy memory cell arrays 23a-0 to 23a-7 are provided in correspondence to the memory cell arrays 21a-0 to 21a-7. Each of the memory cell arrays 21a has 1024 segments, wherein memory array groups connected to two adjacent sub word lines selected by the row address X0 is the segment being a unit replaced when the defective memory cell is generated. Based on the row address X1 and X2, the memory cell array 21a can be considered as segment groups whose unit is four adjacent segments from which one segment can be selected. In the viewpoint, the memory cell array 21a has 256 segment groups which are arranged repeatedly and are selected based on the row address X3 to X10. On the other hand, a sub mat in which the redundancy memory cell array is arranged is selected by the redundancy sub mat decoder 32a to which the row address X1 and X2 are inputted. At this time, the output of the redundancy sub mat decoder 32a is inputted as the same signal to every two circuit groups of the redundancy ROM circuit groups 28a. That is, each of the redundancy ROM circuit groups 28a-0 and 28a-1, 28a-2 and 28a-3, 28a-4 and 28a-5, and 28a-6 and 28a-7 can be considered as one redundancy ROM circuit group. In that case, the number of the redundancy circuit groups is four. Therefore, four segments forming the segment group and four redundancy ROM circuit groups are selected by the same row address X1 and X2, having the corresponding relationship. In other words, the four segments are sequentially allocated to the redundancy memory cell arrays connected to the four redundancy ROM circuit groups. Further, since the four segments are repeated due to the row address X3 to X10, the four segments are cyclically allocated in order to the redundancy memory cell arrays as well.

Also, the segment n (n=0 to 1023) is recurrently allocated in units of four to the same redundancy memory cell array group m (combination of the redundancy memory cell array 23-(2×m) and the redundancy memory cell array 23-(2×m+1)) (m=0 to 3). Therefore, the segment n that satisfies the relationship of n=4×A+m is allocated to the redundancy memory cell array group m (m=0 to 3). Here, A is a value determined by the row address X3 to X10. That is to say, the segment x allocated to the redundancy memory cell array group x all has the same segment number that is specified by the row address X1 and X2.

By performing such allocation to the redundancy memory cell array, one redundancy ROM circuit 28a corresponds to two sub word lines. As compared with the case where redundancy memory cell arrays having the same capacity is used, the number of circuits is reduced by half. In the case of FIG. 10, the number of circuits is four. Therefore, the defect can be repaired under the state where the fuses for holding the defective address specifying the defective memory cell are also reduced by half.

Additionally, the redundancy for the word line (row address) has been described in the present embodiment, which is obviously applicable to the redundancy for the bit line (column address) as well.

In addition, a combination of the first embodiment and the second embodiment is also effective. Half of the redundancy circuits in each sub mat are configured to conduct the repair in units of one sub word as in the case of the first embodiment, and the other half are configured to conduct the repair in units of two sub words as in the case of the second embodiment. Alternatively, the redundancy circuits of half of the sub mats are configured to conduct the repair in units of one sub word as in the case of the first embodiment, and the redundancy circuits of the other half of the sub mats are configured to conduct the repair in units of two sub words as in the case of the second embodiment. By adopting such a combined configuration, it is possible to realize more detailed treatment depending on the status of the defects, which is effective for reduction in the number of the redundancy circuits, particularly that of the fuses.

Figure 11:
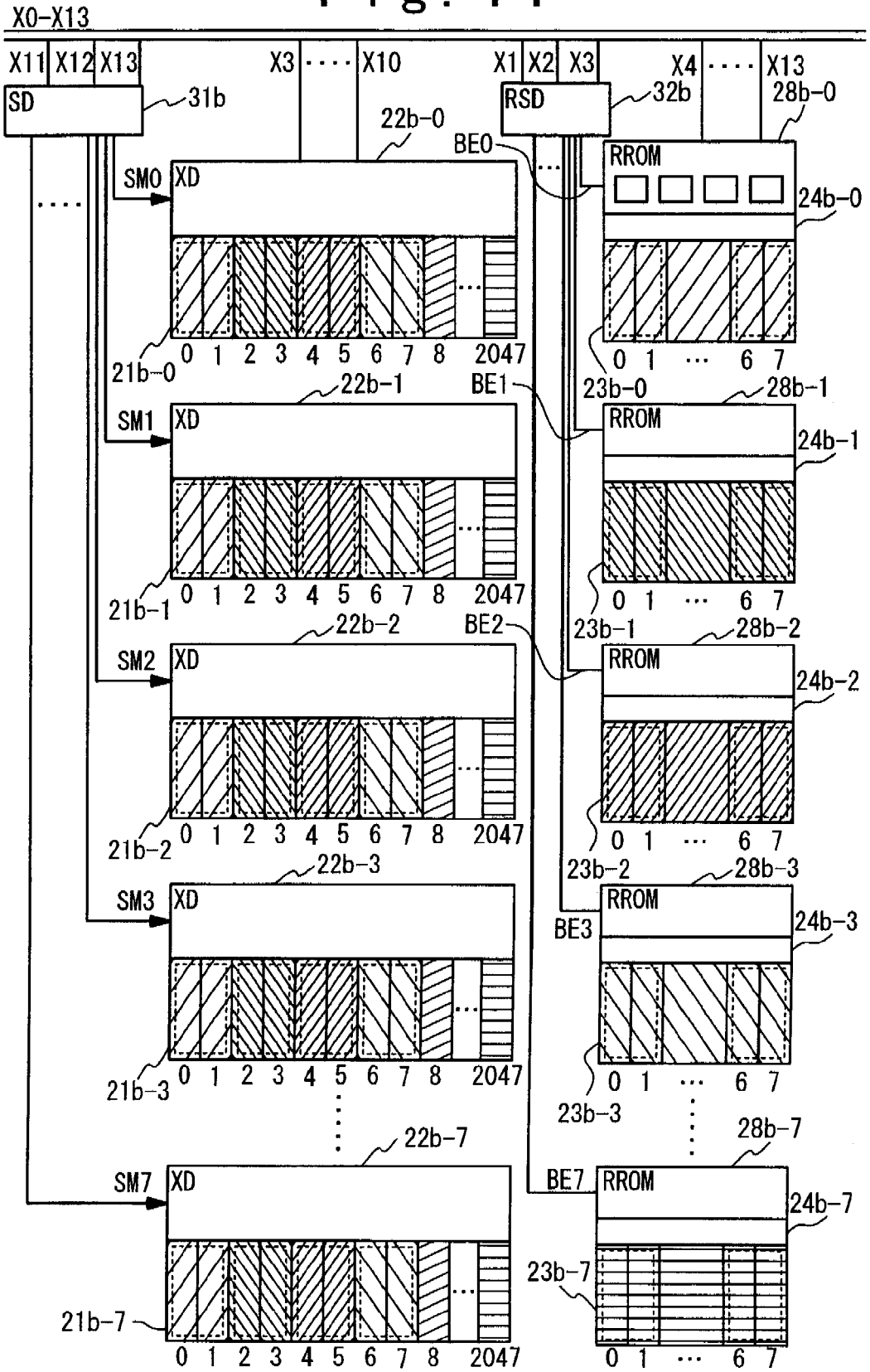
FIG. 11 is a block diagram showing a configuration of the third embodiment according to the present invention.

A third embodiment is described with reference to FIG. 11. In the third embodiment, the defect is repaired with the use of a redundancy circuit, using a memory cell group corresponding to a plurality of sub words as a segment which is a defect repair unit. As compared with the second embodiment, a bit length holding the defective address specifying the defect location is reduced, and the number of fuses used is reduced. In other words, the fuse corresponding to the row address X3 holding a defective address is eliminated, inputted to the redundancy sub mat decoder. Consequently, one memory array and one redundancy array in a sub mat are related one-to-one. FIG. 11 shows a case where replacement is performed in units of two sub words as the segment. Since an allocation relationship between a memory cell array 21b and a redundancy memory cell array 23b in the row address is described here, only a portion relevant to the row address, the address decoder and the memory cell array is shown, and other portions are omitted. Additionally, description is given below on redundancy for a word line (row address), which is obviously applicable to redundancy for a bit line (column address) as well.

A DRAM has a sub mat decoder 31b, memory cell arrays 21b-0 to 21b-7, row address decoders 22b-0 to 22b-7, redundancy memory cell arrays 23b-0 to 23b-7, redundancy row address decoders 24b-0 to 24b-7, redundancy ROM circuit groups 28b-0 to 28b-7 each having four redundancy ROM circuits, and a redundancy sub mat decoder 32b. Additionally, the row address X0 to X2 is inputted to a sub word decoder not shown, and a method of selecting words in the memory cell array is the same as that in the first embodiment. Also, word selection with respect to the redundancy memory cell array is the same as in the second embodiment with reference to FIG. 7C, by changing the reference numerals 23a, 24a, and 27a in FIG. 7C to 23b, 24b, and 27b, respectively.

The sub mat decoder 31b receives the row address X11 to X13, and outputs the sub mat selection signals SM0 to SM7 to respective sub mats. The row address decoders 22b-0 to 22b-7 of respective sub mats receive the row address X3 to X10, the sub word decoder receives the row address X0 to X2, and one of the 2048 word lines of each of the memory cell arrays 21b-0 to 21b-7 is activated. The memory cell arrays 21b-0 to 21b-7 of each sub mat are activated by the corresponding sub mat selection signals SM0 to SM7 from the sub mat decoder 31b, and output data of memory cells that corresponds to one activated word line. The redundancy sub mat decoder 32b receives the row address X1 to X13, and outputs eight redundancy activation signals BE0 to BE7. The eight redundancy activation signals BE0 to BE7 are connected to the redundancy ROM circuit groups 28b-0 to 28b-7, respectively. The activated redundancy ROM circuit groups 28b-0 to 28b-7 receive the row address X4 to X13, and output a comparison result with the defective address specifying the defective memory cell to the redundancy row address decoder 24b-n as the redundancy selection signals RE-n-0 to RE-n-3 (n=0 to 7). The redundancy row address decoder 24b-n receives the redundancy selection signals RE-n-0 to RE-n-3, and activates the redundancy main word line RMWD of the redundancy memory cell array 23a-n (n=0 to 7). One redundancy ROM circuit provided in the redundancy ROM circuit groups 28b-0 to 28b-7 is related to two sub word lines of the redundancy memory cell arrays 23b-0 to 23b-7. Therefore, two sub word drivers 29 are connected to one redundancy main word line RMWD. The redundancy memory cell arrays 23b-0 to 23b-7 have four main word lines driven by the redundancy row address decoders 24-0 to 24-7, and output data of the memory cells connected to the sub word line activated by the sub word driver 29.

Each of the memory cell arrays 21b-0 to 21b-7 has 2048 word lines, and one word line is selected by the row address decoders 22b-0 to 22b-7 receiving and decoding the row address X0 to X10 and the sub word decoder. When all the redundancy ROM circuits 28b determine that the accessed address does not match the defective address, a relevant memory cell in the memory cell arrays 21b-0 to 21b-7 is accessed. When any of the redundancy ROM circuits 28b determines that the accessed address matches the defective address specifying the defective memory cell, the row address decoder killer signal is activated. Since the row address decoders 22b-0 to 22b-7 are invalidated, the memory cells in the memory cell arrays 21b-0 to 21b-7 is not accessed.

The redundancy sub mat decoder 32b decodes the row address X1 to X3, and outputs the eight redundancy activation signals BE0 to BE7. One redundancy activation signal BE activates one of the redundancy ROM circuit groups 28b-0 to 28b-7.

Each of the redundancy memory cell arrays 23b-0 to 23b-7 has eight word lines and is a redundancy memory block for replacing the data of the defective address specifying the defective memory cell in the memory cell arrays 21b-0 to 21b-7. The eight word lines of the redundancy ROM circuit group 23b-n correspond in pairs to each of the redundancy selection signals RE-n-0 to RE-n-3 outputted from the redundancy ROM circuit groups 28b-n (n=0 to 7). The redundancy selection signals RE-n-0 to RE-n-3 each activate one redundancy main word line RMWD by activating the redundancy row address decoder 24b-n (n=0 to 7). One redundancy main word line RMWD is connected to two sub word drivers 29, and one redundancy sub word line RSWD is selected by the row address X0. The row address X0 is not inputted to the redundancy sub mat decoder 32b, and one redundancy ROM circuit to be activated by the redundancy activation signal BE which is the output of the redundancy sub mat decoder 32b corresponds to two word lines. Therefore, the two word lines correspond to two adjacent word lines of the memory cell arrays 21b-0 to 21b-7.

Here, the relationship between the main word lines and the sub word lines in the memory cell arrays 21b-0 to 21b-7 has been described in the first embodiment with reference to FIG. 7A. The relationship is the same in the present embodiment as well, and the description thereof is omitted. Also, the relationship between the main word lines and the sub word lines in the redundancy memory cell arrays 23b-0 to 23b-7 is described in the second embodiment with reference to FIG. 7C, by changing the reference numerals 23a, 24a, and 27a in FIG. 7C to 23b, 24b, and 27b respectively. The relationship is the same in the present embodiment as well, and the description thereof is omitted.

An operation when the memory is accessed is explained. If the memory is accessed, the redundancy ROM circuit group 28b-n each having four redundancy ROM circuits 28b-n-0 to 28b-n-3 (n=0 to 7) compares the defective address specifying the defective memory cell held in the fuses of each of the circuits and the row address X4 to X13 to be inputted. In a case of match, the row address X4 to X13 is determined to be the defective address, and one redundancy selection signal RE is activated. The redundancy main word line that corresponds to the redundancy ROM circuit 28b-n-m (n=0 to 7, m=0 to 3) holding the defective address and the sub word line are selected. Then, the redundancy memory cell array 23b-n is activated, and all the memory cell arrays 21b-0 to 21b-7 are inactivated. Therefore, the redundancy memory cell array 23b is accessed instead of the memory cell array 21b, and the defect in the memory cell array 21b is replaced by the redundancy memory cell array 23b. In the case of mismatch, the accessed address is determined not to the defective address specifying the defective memory cell, and the memory cell array 21b is activated and the normal access is performed.

Each of the redundancy ROM circuits 28b-0 to 28b-7, when activated by the redundancy activation signals BE0 to BE7 which is obtained by decoding the row address X1 to X3, compares the defective address specifying the defective memory cell held in the fuse and the input row address X4 to X13. Therefore, the row address X1 to X13 is compared with the defective address, and memory cells that belong to two adjacent sub words corresponding to the row address X0 are the target of the replacement (segment).

Thus, the segment which is the allocation unit for replacing a defect is two sub memory blocks. In the memory cell array 21b-0 selected by the row address X0 to X10, the memory cell arrays 21b-0-0 and 21b-0-1 are allocated to the redundancy memory cell array 23b-0, the memory cell arrays 21b-0-2 and 21b0-3 are allocated to the redundancy memory cell array 23b-1, and the memory cell arrays 21b-0-4 and 21b-0-5 are allocated to the redundancy memory cell array 23b-2, in order. Allocation is cyclically performed in order, where the memory cell arrays 21b-0-14 and 21b-0-15 are allocated to the redundancy memory cell array 23b-7, and the memory cell arrays 21b-0-16 and 21b-0-17 are allocated to the redundancy memory cell array 23b-0. That is to say, the redundancy memory cell array 23b-n are recurrently allocated to the memory cell arrays 21b-0-0 to 21b-0-2047 for every two sub memory blocks in accordance with the row address X1 to X3 (n=0 to 7).

Further, the memory cell arrays 21b-i-(2×m) and 21b-i-(2×m+1) are sequentially allocated to the redundancy memory cell array 23b-n in the memory cell arrays 21b-1 to 21b-7 as well (i=1 to 7, m=0 to 1023, n=0 to 7, m is the number of segments provided to the memory cell array, n is given by a reminder generated when m is divided by eight as the number of redundancy memory cell arrays which are redundancy memory blocks), as in the case of the memory cell array 21b-0.

In other words, the following description is possible. The redundancy memory cell arrays 23b-0 to 23b-7 are provided in correspondence to the memory cell arrays 21b-0 to 21b-7. Each of the memory cell arrays 21b has 1024 segments of memory array groups connected to two adjacent sub word lines selected by the row address X0, as the segment, which is the unit for the replacement when the defective memory cell is caused. Based on the row address X1 to X3, the memory cell array 21b can be considered as a segment group having eight adjacent segments as a unit, where one of the segments can be selected. In that idea, the memory cell array 21b has 128 segment groups repeatedly arranged that are selected based on the row address X4 to X10. On the other hand, the sub mat to which the redundancy memory cell array is arranged, is selected by the redundancy sub mat decoder 32b to which the row address X1 to X3 is inputted. Therefore, eight segments forming the segment group, and eight sub mats where the redundancy memory cell arrays are arranged, are selected by the same row address X1 to X3, having a correspondence. In other words, the eight segments are allocated in order, to the redundancy memory cell arrays arranged in the eight sub mats. Further, since the eight segments are repeated by the row address X4 to X10, the eight segments are also cyclically allocated in order, to the redundancy memory cell array.

Additionally, the segment n (n=0 to 1023) is repeatedly allocated in units of eight, to the same redundancy memory cell array 23-m (m=0 to 7). Therefore, the segment n that satisfies the relationship of n=8×A+m, is allocated to the redundancy memory cell array 23-m (m=0 to 7). Here, A is a value determined by the row address X4 to X10. That is, the segment allocated to the redundancy memory cell array 23-x all has the same segment number specified by the row address X1 to X3.

If such allocation to the redundancy memory cell array is performed, two sub word lines correspond to one redundancy ROM circuit 28b, reducing the number of circuits by half compared with the case of using the redundancy memory cell array having the same capacity. The number of circuits is four in the case of FIG. 11. Further, the row address for comparing the defective address specifying the defective memory cell is X4 to X13, which is less than the comparison address X3 to X13 in the second embodiment by one bit. Consequently, the defect can be repaired while further reducing the fuses for holding the defective address, compared with the second embodiment.

Additionally, in the present embodiment, the segment as the replacement unit for the defective memory cell is the memory cell group connected to two word lines, which is also applicable in extension, to a memory cell group connected to $2^n$ word lines. Further, the redundancy for the word line (row address) has been described in the present embodiment, which is obviously applicable to the redundancy for the bit line (column address) as well.

Figure 12:
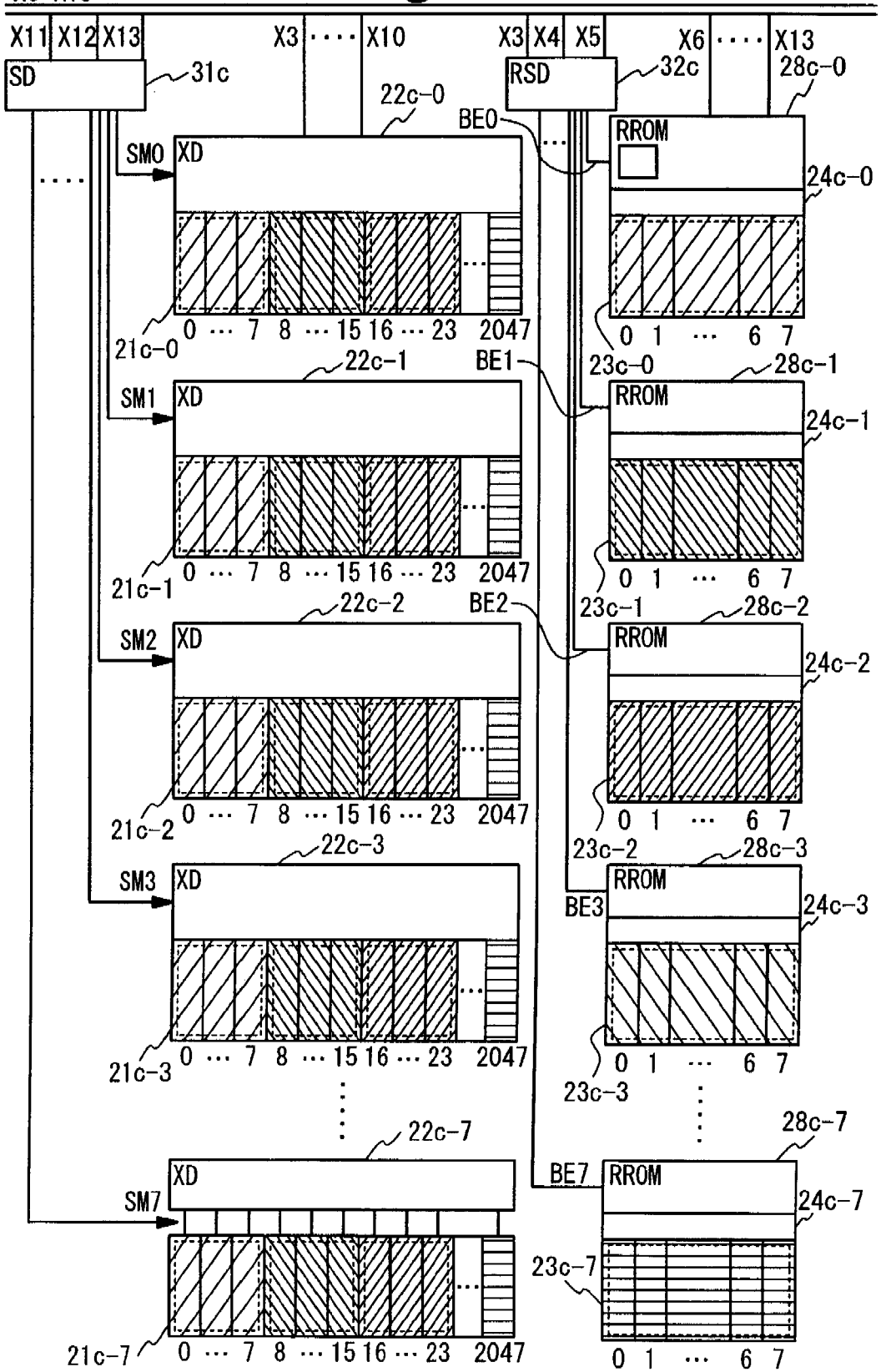
FIG. 12 is a block diagram showing a configuration of the fourth embodiment according to the present invention.

The fourth embodiment is described with reference to FIG. 12. The fourth embodiment is a case where the segment as the unit for a repair by the redundancy circuit, is a memory cell group in a range selected by the main word line. The redundancy memory cell array is driven by one redundancy main word line, and the redundancy memory cell array included in one sub mat repairs one defect. Such a configuration makes it possible to further reduce the number of fuses for holding the defective address specifying the defective memory cell. Here, description is given on the allocation relationship between a memory cell array 21c and a redundancy memory cell array 23c by the row address. Therefore, only a portion relevant to the row address and the memory cell array is shown, and other portions are omitted. Additionally, description is given below on redundancy for the word line (row address), which is obviously applicable to redundancy for the bit line (column address) as well.

A DRAM has memory cell arrays 21c-0 to 21c-7, row address decoders 22c-0 to 22c-7, a sub mat decoder 31c, redundancy memory cell arrays 23c-0 to 23c-7, redundancy row address decoders 24c-0 to 24c-7, redundancy ROM circuits 28c-0 to 28c-7, and a redundancy sub mat decoder 32c. The memory cell array 21c-n, the row address decoder 22c-n, the redundancy memory cell array 23c-n, the redundancy row address decoder 24b-n, and the redundancy ROM circuit 28c-n are provided to the same sub mat (n=0 to 7). Additionally, the row address X0 to X2 is inputted to a sub word decoder not shown, and a word selection method of a memory cell array is the same as that in the first embodiment. Also, word selection of a redundancy memory cell array is described in FIG. 7D.

The sub mat decoder 31c receives the row address X1 to X13, and outputs the sub mat selection signals SM0 to SM7 to each sub mat. The row address decoder 22c-0 to 22c-7 of each sub mat receives the row address X3 to X10, and receives the row address X0 to X2 to the sub word decoder, activating one of the 2048 word lines of each of the memory cell arrays 21c-0 to 21c-7. The memory cell arrays 21c-0 to 21c7 of each sub mat are activated by the corresponding sub mat selection signals SM0 to SM7 from the sub mat decoder 31c, and output data of a memory cell that corresponds to one activated word line among the 2048 word lines selected by the row address decoder 22c-0 to 22c-7, and the sub word decoder. The redundancy sub mat decoder 32c receives the row address X3 to X5, and outputs eight redundancy activation signals BE0 to BE7. The eight redundancy activation signals BE0 to BE7 are connected to the redundancy ROM circuits 28c-0 to 28c-7 respectively. Therefore, the redundancy ROM circuit 28c is selected by the row address X3 to X5, to then be activated. The redundancy ROM circuits 28c-0 to 28c-7 receive the row address X6 to X13, and output a comparison result with the defective address specifying the defective memory cell, to the redundancy row address decoder 24c-n (n=0 to 7), as the redundancy selection signal RE-n. The redundancy row address decoder 24c-n receives the redundancy selection signal RE-n, and activates the redundancy main word line RMWD of the redundancy memory cell array 23c-n (n=0 to 7). Each of the redundancy ROM circuits 28c-0 to 28c-7 corresponds to eight sub word lines included in each of the redundancy memory cell arrays 23c-0 to 23c-7. Therefore, one redundancy main word line RMWD is connected to eight sub word drivers 29. Each of the redundancy memory cell arrays 23c-0 to 23c-7 has one main word line driven by the corresponding redundancy row address decoders 24c-0 to 24c-7, and outputs the data of the memory cell connected to the sub word line activated by the sub word driver 29.

The memory cell arrays 21c-0 to 21c-7 are each provided with 2048 word lines that are selected by decoding the row address X0 to X10 by using the row address decoder 22c-0 to 22c-7 and the sub word decoder. When all the redundancy ROM circuits 28c judge that the accessed address does not correspond to the defective address, the memory cell arrays 21c0 to 21c-7 have a relevant memory cell to be accessed. If any of the redundancy ROM circuits 28c judges that the accessed address corresponds to the defective address, the row address decoder killer signal is activated, and the row address decoders 22c-0 to 22c7 get invalid. Therefore, the memory cell of the memory cell arrays 21c-0 to 21c-7 is not accessed.

The redundancy sub mat decoder 32c receives and decodes the row address X3 to X5, and outputs the eight redundancy activation signals BE0 to BE7 to the redundancy ROM circuits 28c-0 to 28c-7. Therefore, the redundancy ROM circuits 28c-0 to 28c-7 are selected based on the row address X3 to X5, to then be activated.

The redundancy memory cell arrays 23c-0 to 23c-7 each having eight word lines, are redundancy memory blocks for replacing the data of the defective address specifying the defective memory cell of the memory cell arrays 21c-0 to 21c-7. Eight word lines of the redundancy memory cell array 23c-n correspond to the redundancy selection signal RE-n outputted from the redundancy ROM circuit 28c-n. The redundancy selection signal RE-n each activates one redundancy main word line RMWD by the redundancy row address decoder 24c-n. One redundancy main word line RMWD is connected to eight sub word drivers 29, and one redundancy sub word line RSWD is selected by the row address X0 to X2. Since the row address X0 to X2 showing the address of the sub word is not inputted to the redundancy sub mat decoder 32c, eight word lines to be activated correspond to the main word line MWD of the memory cell arrays 21c-0 to 21c-7.

Figure 7D:
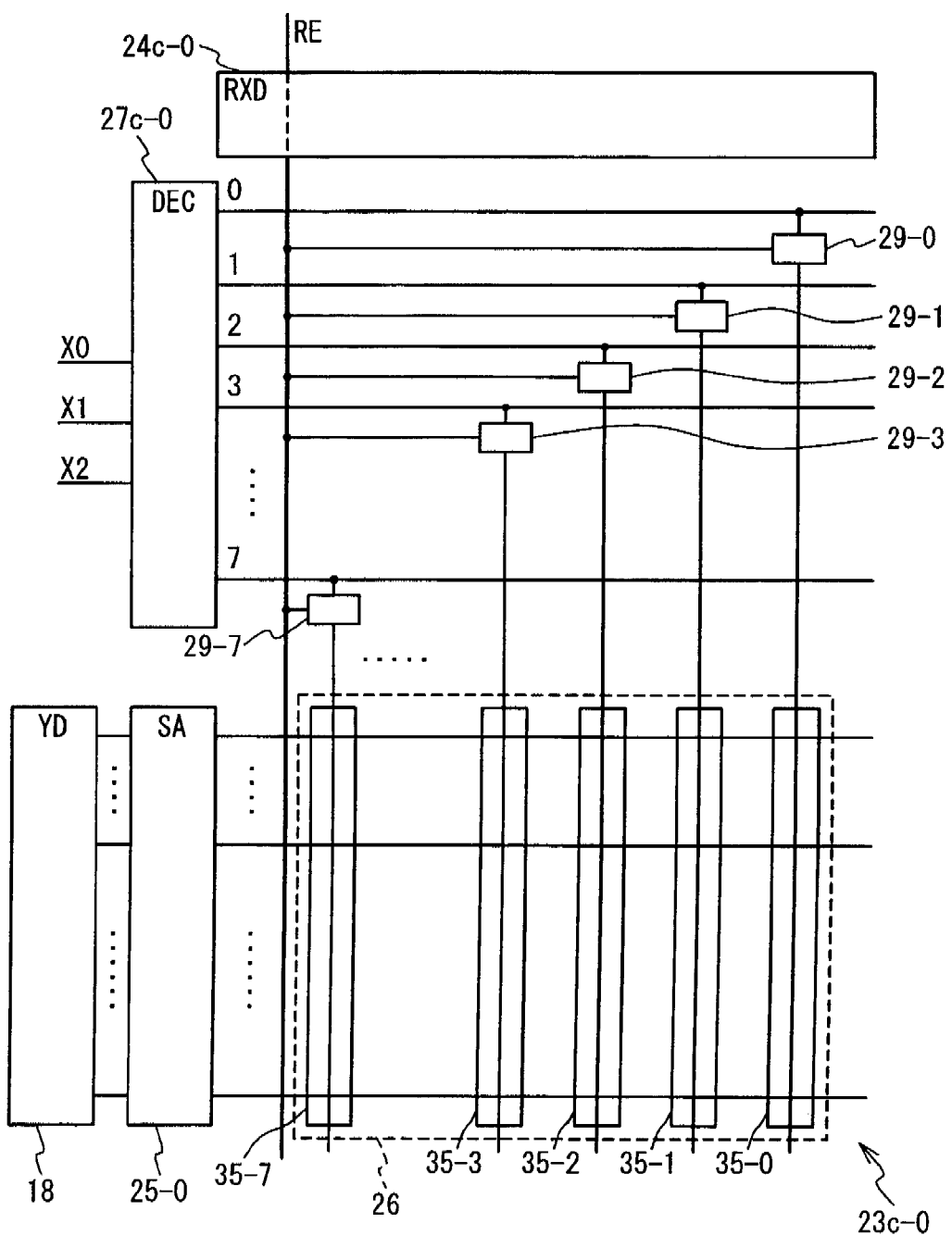
FIG. 7D is a block diagram showing a relationship between a main word line MWD and a sub word line SWD in a redundancy memory cell array according to a fourth embodiment of the present invention.

Here, description is given on the relationship between the main word line and the sub word line in the redundancy memory cell arrays 23c-0 to 23c-7, and on the allocation relationship between the sub memory block of the memory cell arrays 21c-0 to 21c-7 having a defect, and the redundancy sub memory block of the redundancy memory cell arrays 23c-0 to 23c-7 for replacing the former. The relationship between the main word line and the sub word line in the memory cell arrays 21c-0 to 21c-7 was described in the first embodiment with reference to FIG. 7A. The relationship is the same in the present embodiment as well, and the description thereof is omitted. The relationship between the main word line and the sub word line in the redundancy memory cell arrays 23c-0 to 23c-7 is explained with reference to FIG. 7D. FIG. 7D shows the redundancy memory cell array 23c-0 in the sub mat 17-0, and relevant redundancy row address decoder 24c-0, sub word decoder 27c-0, sense amplifier 25-0, and column address decoder 18.

The redundancy row address decoder 24c-0 receives the redundancy selection signal RE-0, and activates one redundancy main word line RMWD that corresponds to the redundancy selection signal RE-0. The sub word decoder 27c-0 outputs eight decode signals activated based on the row address X0 to X2. In the redundancy memory array 23c-0, the sub word driver 29 activates the redundancy sub word line RSWD based on the activated decode signal and the redundancy main word line RMWD, and activates the sub memory block 35, which is the memory cell group connected to the redundancy sub word line RSWD. The sense amplifier 25-0 is selected by the column address decoder 18 based on the column address, data stored in the memory cell activated by the sense amplifier 25-0 is read, and data inputted from the outside is written.

The sub word decoder 27c-0 outputs eight decode signals activated based on the row address X0 to X2. The sub word drivers 29-0 to 29-7 are arranged at intersection points of the decode signal line and the redundancy main word line. The sub word drivers 29-0 to 29-7 each activate one redundancy sub word line RSWD based on the redundancy main word line RMWD and the decode signal. Since the sub word drivers 29-0 to 29-7 correspond to eight decode signals of the sub word decoder 27c-0 respectively, the sub word drivers 29-0 to 29-7 receive the decode signals activated when the row address X0 to X2 is "0" to "7". Such connection makes it possible to specify the sub memory block in the segment. The same connection is performed to other sub mats as well.

Additionally, in such connection, the segment, which is the allocation unit for repairing the defect of the memory cell array by using the redundancy memory array, is eight sub memory blocks. Therefore, the sub memory blocks 35-0 to 35-7 are allocated as the redundancy segment 26, serving as the memory array for replacing the defect generated in eight adjacent sub words (one main word) of the memory arrays 21-0 to 21-7. The allocated redundancy segment repairs the defect by replacing each one sub memory block of the memory cell arrays 21c-0 to 21c-7 having the defect and being accessed.

An operation when the memory is accessed is described. If the memory is accessed, the redundancy ROM circuits 28c-0 to 28c-7 activated by an output signal of the redundancy sub mat decoder 32c receive the row address X6 to X13, and compare the inputted row address X6 to X13 with the defective address specifying the defective memory cell of the memory cell array 21c-0 to 21c-7 held in the fuse provided inside. In the case of match as a result of the comparison, the input row address X6 to X13 is regarded as the defective address specifying the defective memory cell, the redundancy selection signal RE being activated. The redundancy row address decoder 24c-n to which the activated redundancy selection signal RE is supplied, activates the redundancy main word line RMWD. Then, the redundancy main word line that corresponds to the redundancy ROM circuit 28c-n holding the corresponded address, and the sub word line are selected, and the redundancy memory cell array 23c-n is activated. In addition to the activation of the redundancy memory cell array 23c-n, all the memory cell arrays 21c-0 to 21c-7 are inactivated by the row address decoder killer signal. Therefore, the redundancy memory cell array 23c is accessed instead of the memory array 21c, and the defect of the memory cell array 21c is replaced by using the redundancy memory cell array 23c. In the case of mismatch as a result of the comparison, the accessed address is regarded not to be the defective address specifying the defective memory cell, and the memory cell array 21c is activated and normal access is performed.

Each of the redundancy ROM circuits 28c-0 to 28c-7, when activated by the redundancy activation signals BE0 to BE7 which is obtained by decoding the row address X3 to X5, compares the defective address specifying the defective memory cell held in the fuses with the input row address X6 to X13. Therefore, the row address X3 to X13 is compared with the defective address, and a memory cell that belongs to one main word that includes eight sub words corresponding to the row address X0 to X2 is the object of replacement (segment).

Thus, the segment as the allocation unit for replacing the defect is eight sub memory blocks (corresponding to the main word). In the memory cell array 21c-0 selected by the row address X0 to X10, the memory cell arrays 21c-0-0 to 21c-0-7 are allocated to the redundancy memory cell array 23c-0, the memory cell arrays 21c-0-8 to 21c-0-15 are allocated to the redundancy memory cell array 23c-1, and the memory cell arrays 21c-0-16 to 21c-0-23 are allocated to the redundancy memory cell array 23c-2 sequentially. Further, the allocation is cyclically performed in order, where the memory cell arrays 21c0-56 to 21c-0-63 are allocated to the redundancy memory cell array 23c-7, and then the memory cell arrays 21c-0-64 to 21c-0-71 are allocated to the redundancy memory cell array 23c-n.

Further, the memory cell array 21c-i-(8m) to 21c-i-(8m+7) are allocated in order, to the redundancy memory cell array 23c-n in the memory cell arrays 21c-1 to 21c-7 as well, as in the case of the memory cell array 21c-0 (m=0 to 255, n=0 to 7, m is the number of segments provided to the memory cell array, n is given by a reminder obtained when m is divided by eight which the number of redundancy memory blocks).

If such allocation to the redundancy memory cell array is performed, one redundancy ROM circuit 28c corresponds to eight sub word lines, namely one main word line, the number of circuits being one-eighth compared with the case where a redundancy memory cell array with the same capacity is used. In FIG. 12, eight sub words are used for one circuit. Also, since the defective address specifying the defective memory cell to be held in the redundancy ROM circuit 28c has only eight bits, which are X6 to X13, the number of fuses per circuit can also be reduced. Therefore, reduction in the number of circuits and in the number of fuses per circuit makes it possible to greatly reduce the number of fuses per memory chip and repair the defect. In addition, if the capacity of the redundancy memory array 23c is increased, the present embodiment can be extended and applied to a plurality of main word lines.

The redundancy circuit of the row side has been described in the above embodiments for simplification of explanation, which is clearly applicable to the redundancy circuit of the column side as in the case of the row side, if the segment is read as a memory cell group connected to the same bit line and a plurality of adjacent bit lines. Further, description has been made on the allocation of the redundancy memory block with an example of the DRAM. However, it is clear that the present invention can be applicable not only to the DRAM but also to a memory having a redundancy memory.

The invention claimed is:

1. A method of replacing a defect memory cell with a redundant memory cell in a semiconductor memory device which includes a plurality of memory blocks each having a plurality of segments each containing a plurality of memory cells and a plurality of redundant memory blocks each provided for an associated one of the plurality of memory blocks, the method comprising:

storing redundant information indicative of segments having defect cells among the plurality of segments in a memory block among the plurality of memory blocks, wherein data cannot be read from or written to said defect cells;

sequentially allocating the segments having defect cells to selected ones of the redundant memory blocks; and replacing the segments having defect cells with the selected ones of the redundant memory blocks, respectively, wherein said replacing comprises reading said data from or writing said data to the selected ones of said redundant memory blocks.

2. The method as claimed in claim 1, further comprising supplying address information to perform one of data read and write operations on the memory device, wherein the allocating the segment having defect cells comprises:

comparing the address information with the redundant information to produce a comparison result; and identifying the segments having defect cells in response to the comparison result.

3. A method of replacing a defect memory cell with a redundant memory cell in a semiconductor memory device which includes a plurality of memory blocks and a plurality of redundant memory blocks each provided for an associated one of the plurality of memory blocks, each of the plurality of memory blocks having a plurality of segments, and each of the plurality of segments containing a plurality of memory cells, the method comprising:

identifying plural segments each having one or more defect cells among the plurality of segments in a memory block among the plurality of memory blocks, wherein data cannot be read from or written to said defect cells;

sequentially allocating a first one of the plural segments to one of the redundant memory blocks, which belongs to the memory block that includes the plural segments, and a second one of the plural segments to another of the redundant memory blocks, which belongs to the memory block that does not includes the plural segments; and replacing the plural segments by the one and another of the redundant memory blocks, respectively, wherein said replacing comprises reading said data from or writing said data to the one or another of said redundant memory blocks.

4. The method as claimed in claim 3, further comprising storing address information indicative of the plural segments into one of the redundant memory blocks.

5. The method as claimed in claim 4, wherein the identifying the plural segments is carried out by comparing the address information stored in the one of the redundant memory blocks with access address information supplied to the memory device.

6. The method of claim 1, wherein said sequential allocating comprises cyclically allocating the segments having defect cells to the selected ones of the redundant memory blocks.

7. The method of claim 3, wherein said sequential allocating comprises cyclically allocating the plural segments to the plurality of redundant memory blocks.

8. A method of replacing a defect memory cell with a redundant memory cell in a semiconductor memory device that includes a plurality of memory banks each including a plurality of normal memory blocks, each of the normal memory blocks including a plurality of normal memory cells, the method comprising:

providing a plurality of redundant memory blocks to the normal memory blocks in each of the memory banks, respectively, the redundant memory blocks being thereby equal in number to the normal memory blocks, each of the redundant memory blocks including a plurality of redundant memory cells;

storing a plurality of redundant information each indicative of a defect memory cell among the normal memory cells, the plurality of redundant information including first and second redundant information indicating respectively first and second normal memory cells among the normal memory cells each belonging to one of the normal memory blocks, the one of the normal memory blocks thereby including the first and second normal memory cells; and replacing the first normal memory cell indicated by the first redundant information with one of the redundant memory cells each belonging to a first one of the redundant memory blocks and the second normal memory cell indicated by the second redundant information with one of the redundant memory cells each belonging to a second one of the redundant memory blocks, which is different from the first one of the redundant memory blocks.

9. The method as claimed in claim 8, wherein each of the normal memory blocks further includes a plurality of normal word lines and a decoder selecting one of the normal word lines and each of the redundant memory blocks further includes a plurality of redundant word lines, a selection to the redundant word lines being performed by the decoder of an associated one of the normal, memory blocks.

10. The method as claimed in claim 8, wherein each of the normal memory cells and each of the redundant memory cells are of a dynamic random access memory cell.

11. The method as claimed in claim 8, wherein the semiconductor memory device includes a plurality of memory sub mats, each of the memory sub mat being constituted by the normal memory blocks and the redundant memory blocks.

12. The method as claimed in claim 11, wherein each of the memory banks is constituted by plural ones of the memory sub mats.

13. A method of replacing a defective memory cell with a redundant memory cell in a semiconductor memory device that includes a plurality of memory banks each including a plurality of normal memory blocks and a plurality of redundant memory blocks, each of the normal memory blocks including a plurality of normal memory cells, each of the redundant memory blocks including a plurality of redundant memory cells, the method comprising:

storing first redundant information associating a first defective normal memory cell among the normal memory cells with a first redundant memory cell among the redundant memory cells;

storing second redundant information associating a second defective normal memory cell among the normal memory cells with a second redundant memory cell among the redundant memory cells, each of said first and second normal memory cells belonging to one of the normal memory blocks;

replacing the first defective normal memory cell with the first redundant memory cell which belongs to a first one of the redundant memory blocks; and replacing the second defective normal memory cell with the second redundant memory cell which belongs to a second one of the redundant memory blocks which is different from the first one of the redundant memory blocks.

14. The method as claimed in claim 13, further comprising:

storing third redundant information associating a third defective normal memory cell among the normal memory cells with a third redundant memory cell among the redundant memory cells;

storing fourth redundant information associating a fourth defective normal memory cell among the normal memory cells with a fourth redundant memory cell among the redundant memory cells, each of the third and fourth normal memory cells belonging to another of the normal memory blocks which is different from the one of the normal memory blocks;

replacing the third defective normal memory cell with the third redundant memory cell which belongs to the first one of the redundant memory blocks; and replacing the fourth defective normal memory cell with the fourth redundant memory cell which belongs to the second one of the redundant memory blocks.

15. The method as claimed in claim 13, further comprising:

storing third redundant information associating a third defective normal memory cell among the normal memory cells with a third redundant memory cell among the redundant memory cells;

storing fourth redundant information associating a fourth defective normal memory cell among the normal memory cells with a fourth redundant memory cell among the redundant memory cells, each of the third and fourth normal memory cells belonging to another of the normal memory blocks which is different from the one of the normal memory blocks;

replacing the third defective normal memory cell with the third redundant memory cell which belongs to one of the first and second ones of the redundant memory blocks; and replacing the fourth defective normal memory cell with the fourth redundant memory cell which belongs to a third one of the redundant memory blocks which is different from each of the first and second ones of the redundant memory blocks.

16. The method as claimed in claim 13, further comprising:

storing third redundant information associating a third defective normal memory cell among the normal memory cells with a third redundant memory cell among the redundant memory cells;

storing fourth redundant information associating a fourth defective normal memory cell among the normal memory cells with a fourth redundant memory cell among the redundant memory cells, each of the third and fourth normal memory cells belonging to another of the normal memory blocks which is different from the one of the normal memory blocks;

replacing the third defective normal memory cell with the third redundant memory cell which belongs to a third one of the redundant memory blocks which is different from each of the first and second ones of the redundant memory blocks; and replacing the fourth defective normal memory cell with the fourth redundant memory cell which belongs to a fifth one of the redundant memory blocks which is different from each of the first, second and third ones of the redundant memory blocks.

17. A method of replacing a defective memory cell with a redundant memory cell in a semiconductor memory device that includes at least first and second memory banks, the first memory bank including a plurality of first memory blocks, each of the first memory blocks including a plurality of normal memory cells and a plurality of redundant memory cells, the second memory bank including a plurality of second memory blocks, each of the second memory blocks including a plurality of normal memory cells and a plurality of redundant memory cells, the method comprising:

storing first defective address information indicative of a first defective normal memory cell among the normal memory cells in the first memory bank;

storing second defective address information indicative of a second defective normal memory cell among the normal memory cells in the first memory bank, the first and second defective normal memory cells belonging to one of the first memory blocks in the first memory bank;

replacing, in response to the first defective address information, the first defective normal memory cell with a first redundant memory cell which belongs to a first one of the first memory blocks in the first memory bank; and replacing, in response to the second defective address information, the second defective normal memory cell with a second redundant memory cell which belongs to a second one of the first memory blocks in the first memory bank which is different from the first one of the first memory blocks in the first memory bank.

18. The method as claimed in claim 17, further comprising:

storing third defective address information indicative of a third defective normal memory cell among the normal memory cells in the second memory bank;

storing fourth defective address information indicative of a fourth defective normal memory cell among the normal memory cells in the second memory bank, the third and fourth defective normal memory cells belonging to one of the second memory blocks in the second memory bank;

replacing, in response to the third defective address information, the third defective normal memory cell with a third redundant memory cell which belongs to a third one of the second memory blocks in the second memory bank; and replacing, in response to the fourth defective address information, the fourth defective normal memory cell with a fourth redundant memory cell which belongs to a fourth one of the second memory blocks in the second memory bank which is different from the third one of the second memory blocks in the second memory bank.

19. The method as claimed in claim 17, wherein the first redundant memory cell belongs to the one of the first memory blocks together with the first and second defective normal memory cells.

20. The method as claimed in claim 18, wherein the first redundant memory cell belongs to the one of the first memory blocks together with the first and second defective normal memory cells and the third redundant memory cell belongs to the one of the second memory blocks together with the third and fourth defective normal memory cells.

21. The method as claimed in claim 17, wherein the plurality of normal memory cells in each of the first memory blocks in the first memory bank are divided into a plurality of normal segments each having plural ones of the normal memory cells and the plurality of redundant memory cells in each of the first memory blocks in the first memory bank are divided into a plurality of redundant segments each having plural ones of the redundant memory cells, the first defective normal memory cell being contained in a first one of the normal segments in the one of the first memory blocks, the second defective normal memory cell being contained in a second one of the normal segments in the one of the first memory blocks which is different from the first one of the normal segments in the one of the first memory blocks, the first redundant memory cell being contained in one of the redundant segments in the first one of the first memory blocks, the second redundant memory cell being contained in one of the redundant segments in the second one of the first memory blocks; and wherein the replacing the first defective normal memory cell with the first redundant memory cell is carried out by replacing the first one of the normal segments in the one of the first memory blocks with the one of the redundant segments in the first one of the first memory blocks, and the replacing the second defective normal memory cell with the second redundant memory cell is carried out by replacing the second one of the normal segments in the one of the first memory blocks with the one of the redundant segments in the second one of the first memory blocks.

22. The method as claimed in claim 18, wherein the plurality of normal memory cells in each of the first memory blocks in the first memory bank are divided into a plurality of normal segments each having plural ones of the normal memory cells and the plurality of redundant memory cells in each of the first memory blocks in the first memory bank are divided into a plurality of redundant segments each having plural ones of the redundant memory cells, the first defective normal memory cell being contained in a first one of the normal segments in the one of the first memory blocks, the second defective normal memory cell being contained in a second one of the normal segments in the one of the first memory blocks which is different from the first one of the normal segments in the one of the first memory blocks, the first redundant memory cell being contained in one of the redundant segments in the first one of the first memory blocks, the second redundant memory cell being contained in one of the redundant segments in the second one of the first memory blocks;

wherein the plurality of normal memory cells in each of the second memory blocks in the second memory bank are divided into a plurality of normal segments each having plural ones of the normal memory cells and the plurality of redundant memory cells in each of the second memory blocks in the second memory bank are divided into a plurality of redundant segments each having plural ones of the redundant memory cells, the third defective normal memory cell being contained in a third one of the normal segments in the one of the second memory blocks, the fourth defective normal memory cell being contained in a fourth one of the normal segments in the one of the second memory blocks which is different from the third one of the normal segments in the one of the second memory blocks, the third redundant memory cell being contained in one of the redundant segments in the third one of the second memory blocks , the fourth redundant memory cell being contained in one of the redundant segments in the fourth one of the second memory blocks;

wherein the replacing the first defective normal memory cell with the first redundant memory cell is carried out by replacing the first one of the normal segments in the one of the first memory blocks with the one of the redundant segments in the first one of the first memory blocks, and the replacing the second defective normal memory cell with the second redundant memory cell is carried out by replacing the second one of the normal segments in the one of the first memory blocks with the one of the redundant segments in the second one of the first memory blocks; and wherein the replacing the third defective normal memory cell with the third redundant memory cell is carried out by replacing the third one of the normal segments in the one of the second memory blocks with the one of the redundant segments in the third one of the second memory blocks, and the replacing the fourth defective normal memory cell with the fourth redundant memory cell is carried out by replacing the fourth one of the normal segments in the one of the second memory blocks with the one of the redundant segments in the fourth one of the second memory blocks.

* * * * *